(12) United States Patent
Murata

(10) Patent No.: US 6,568,863 B2
(45) Date of Patent: May 27, 2003

(54) PLATFORM AND OPTICAL MODULE, METHOD OF MANUFACTURE THEREOF, AND OPTICAL TRANSMISSION DEVICE

(75) Inventor: Akihiro Murata, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/800,482

(22) Filed: Mar. 8, 2001

(65) Prior Publication Data

US 2002/0061173 A1 May 23, 2002

(30) Foreign Application Priority Data

Apr. 7, 2000 (JP) ........................................ 2000-106400

(51) Int. Cl.[7] ................................................ G02B 6/36
(52) U.S. Cl. .............................. 385/89; 385/88; 264/1.1
(58) Field of Search ....................... 385/88–92; 264/1.24, 264/1.25, 1.1

(56) References Cited

U.S. PATENT DOCUMENTS

| | | | | |
|---|---|---|---|---|
| 4,017,962 A | * | 4/1977 | Palmer | 257/432 |
| 5,165,002 A | * | 11/1992 | Cumberledge et al. | 385/92 |
| 5,201,018 A | * | 4/1993 | Coden et al. | 385/88 |
| 5,574,806 A | * | 11/1996 | Kragl et al. | 385/14 |
| 5,692,083 A | * | 11/1997 | Bennett | 385/88 |

* cited by examiner

Primary Examiner—Robert H. Kim
Assistant Examiner—Michael H Caley
(74) Attorney, Agent, or Firm—Oliff & Berridge, PLC

(57) ABSTRACT

A method of manufacturing a platform includes the steps of providing an interconnecting line adhering first and second regions of a mold, disposing an optical fiber with its end surface facing the mold, sealing the optical fiber and the interconnecting line with a molding material, and removing the interconnecting line and the molding material together with the optical fiber from the mold.

35 Claims, 18 Drawing Sheets

PLATFORM AND OPTICAL MODULE, METHOD OF MANUFACTURE THEREOF, AND OPTICAL TRANSMISSION DEVICE

BACKGROUND TO THE INVENTION

1. Field of the Invention

The present invention relates to a platform and optical module, a method of manufacture thereof, and an optical transmission device.

2. Description of the Related Art

In recent years, there has been a trend toward increased speeds and volumes in data communications, and developments in optical communications continue. In optical communications, an electrical signal is converted to an optical signal, the optical signal is transmitted through an optical fiber, and then the received optical signal is converted to an electrical signal. The conversion between electrical signals and optical signals is done by optical elements. An optical module comprising an optical element mounted over a platform is also known.

Conventionally, the method is known of forming interconnecting lines on an injection molding by electroless plating or the like, to fabricate a component. This method can be applied to the fabrication of a platform. However, in that case, since the interconnecting lines are formed on the surface of the injection molding, the surface of the platform has projections formed by the interconnecting lines, and its planarity cannot be assured.

SUMMARY OF THE INVENTION

A method of manufacturing a platform of the present invention comprises steps of:

providing a mold having first and second regions with an interconnecting line which adheres to at least one of the first and second regions;

disposing an optical fiber with one end surface of the optical fiber facing the mold;

sealing the optical fiber and the interconnecting line with a molding material, avoiding the one end surface and a surface of the interconnecting line which is in contact with the mold; and removing the interconnecting line and the molding material together with the optical fiber from the mold.

A method of manufacturing an optical module of the present invention comprises steps of:

fabricating a platform by the method as defined in claim 1, mounting an optical element over the platform, and electrically connecting the optical element and the interconnecting line.

A platform of the present invention comprises a resin molded component, and an interconnecting line at least part of which exposes from the molded component, in which an optical fiber having one end surface exposed is fixed to the molded component.

An optical module of the present invention comprises:

the above described platform; and an optical element electrically connected to the interconnecting line and mounted over the platform.

An optical transmission device of the present invention comprises:

the above described plurality of platforms;

an optical element mounted over each of the platforms; and the optical fiber attached to each of the platforms, wherein the optical element is a light-receiving element or a light-emitting element, and wherein the optical element is electrically connected to the exposed part of the interconnecting line.

DESCRIPTION OF THE EMBODIMENTS

Figure 1:
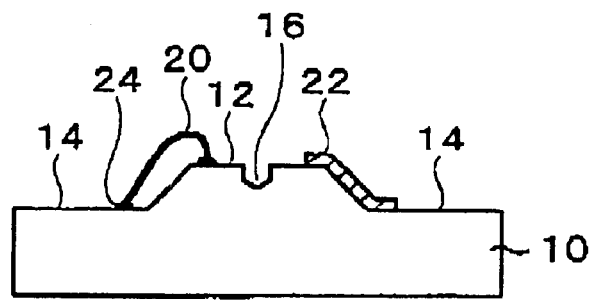
FIG. 1 shows a first embodiment of the method of manufacturing a platform according to the present invention.

Embodiments of the present invention are now described. The embodiments solve the above mentioned problem, and have objective to provide a platform and optical module having no projection formed by an interconnecting line, a method of manufacture thereof, and an optical transmission device.

(1) A method of manufacturing a platform according to the embodiments of the present invention comprises steps of:

providing a mold having first and second regions with an interconnecting line which adheres to at least one of the first and second regions;

disposing an optical fiber with one end surface of the optical fiber facing the mold;

sealing the optical fiber and the interconnecting line with a molding material, avoiding the one end surface and a surface of the interconnecting line which is in contact with the mold; and removing the interconnecting line and the molding material together with the optical fiber from the mold.

According to this embodiment, an interconnecting line is provided with its end in contact with the mold, and then the interconnecting line is sealed with the molding material. Portions of the interconnecting line other than the surfaces in contact with the mold are sealed with the molding material. Then the molding material is formed by the mold, and when the interconnecting line together with the molding material is removed from the mold, except for the surfaces in contact with the mold, the interconnecting line is embedded in the molding material. Therefore, projections are not formed by the interconnecting lines.

(2) In this method of manufacturing a platform:

the interconnecting line may be formed of wire, and both ends of the wire may be bonded to the first and second regions.

By means of this, a platform can be obtained in which the surfaces of both ends of the wire in contact with the mold are exposed, and other portions are sealed internally. Since the wire is sealed, disconnection therein can be prevented.

(3) In this method of manufacturing a platform:

a bonding pad may be previously provided to the mold, and the wire may be bonded to the bonding pad.

By means of this, even if the mold of a material which does not allow an easy wire bonding is used, the wire bonding is enabled by forming a conducting film.

(4) In this method of manufacturing a platform:

the interconnecting line may be formed of a conductive layer, and the conductive layer may be formed in the first and second regions.

By means of this, a platform can be obtained in which the surfaces of the conductive layer in contact with the mold are exposed, and other portions are sealed internally.

(5) In this method of manufacturing a platform:

the optical fiber and the interconnecting line may be sealed by the molding material, a mold release agent being applied to the mold.

By means of this, the mold release characteristics of the molding material can be improved.

(6) In this method of manufacturing a platform:

a support member for the optical fiber may be attached to the mold; and the optical fiber may be disposed being positioned by the support member.

By means of this, since the platform is formed by processing the molding material by the mold, it can be formed in a precise shape, and the optical fiber can be provided at a precise position with respect to this precise shape.

(7) In this method of manufacturing a platform:

the optical fiber may be disposed being positioned by inserting the one end of the optical fiber in a hole formed in the mold.

By means of this, since the platform is formed by processing the molding material by the mold, it can be formed in a precise shape, and the optical fiber can be provided at a precise position with respect to this precise shape.

(8) In this method of manufacturing a platform:

the first region of the mold may be formed substantially even; and the hole may be formed in the first region.

By means of this, the optical fiber is inserted in the hole and sealed by the molding material. Therefore, a platform, in which the end of the optical fiber projects from the surface of the molding material formed by the first region of the mold can be obtained.

(9) In this method of manufacturing a platform:

the mold may have a projected portion in the first region, and the hole may be formed in the upper surface of the projected portion.

By means of this, a recess is formed in the molding material by the projected portion of the mold. Since the hole in which the optical fiber is to be inserted is formed by the projected portion of the mold, the end of the optical fiber is positioned in the recess formed in the molding material. Therefore, a platform, in which the end of the optical fiber does not project from the surface formed in the molding material by the first region, can be obtained.

(10) In this method of manufacturing a platform:

the mold may be formed with the first region projecting further than the second region; and an indent corresponding to a shape of the mold may be formed in the molding material.

For example, the indent may be formed of a size and depth to contain the optical element.

(11) In this method of manufacturing a platform:

the mold may have a projection, and the interconnecting line may be in adhered to a region in which the projection is formed; and a recess may be formed in the molding material.

By means of this, a construction which achieves electrical connection between the interconnecting line and other elements in the recess can be obtained.

(12) This method of manufacturing a platform may further comprises a step of filling the recess with a conductive material.

By means of this, the interconnecting line and other elements can be electrically connected through the conductive material.

(13) In this method of manufacturing a platform:

an electronic component electrically connected to the interconnecting line may be mounted over the mold; and the optical fiber and the interconnecting line, and the electronic component may be sealed with the molding material.

By means of this, a platform incorporating an electronic component can be obtained.

(14) In this method of manufacturing a platform:

the mold may have the first region, the second region provided in a position lower than the first region, and a third region provided between the first and the second regions; and in the step of providing the interconnecting line, the interconnecting line may be adhered to the first or second region, and the third region.

By means of this, a multiply stepped indent can be formed in the molding material by the mold including a plurality of steps. In the indent, an optical element or semiconductor chip or the like can be mounted.

(15) A method of manufacturing an optical module according to the embodiments of the present invention comprises steps of fabricating a platform by the above described method, mounting an optical element over the platform, and electrically connecting the optical element and the interconnecting line.

According to this embodiment, the effect described in the above described method of manufacturing a platform can be achieved. Then an optical element can be mounted over a platform in which projections are not formed by the interconnecting line.

(16) This method of manufacturing an optical module may comprise a step of providing a resin which seals the optical element.

By means of this, the optical element can be protected.

(17) In this method of manufacturing an optical module:

at least between the optical fiber and the optical element, a resin having a light transmitting property may be formed as the resin.

(18) In this method of manufacturing an optical module:

a platform having a third region may be manufactured by the above described method; and a semiconductor chip may be mounted in the third region of the platform.

According to this embodiment, a multiply stepped indent can be formed in the platform, and an optical element or semiconductor chip can be contained in the indent in a compact way.

(19) A platform according to the embodiments of the present invention comprises a resin molded component, and an interconnecting line at least part of which exposes from the molded component, in which an optical fiber having one end surface exposed is fixed to the molded component.

According to this embodiment, except for a part, the interconnecting line is embedded in the molded component, and therefore projections are not formed by the interconnecting lines.

(20) In this platform:

a metal support member embedded in the molded component may be further comprised, and the optical fiber may be supported by the support member.

By means of this, since the support member is of metal, having high thermal conductivity and electrical conductivity, these properties can be effectively used.

(21) In this platform:

an indent may be formed in the molded component; and the optical fiber may be fixed in the indent with the one end surface exposed.

The indent may be formed of a size and depth to contain the optical element.

(22) In this platform:

the exposed one end surface of the optical fiber may be positioned without projecting from a bottom surface of the indent in the molded component.

By means of this, contact of the one end surface of the optical fiber with the optical element is avoided.

(23) In this platform:

the indent may have a plurality of bottom surfaces forming steps; and on each of the bottom surfaces, the at least part of the interconnecting line may be exposed.

Since the indent has a multiply stepped form, an optical element or semiconductor chip or the like can be mounted over each step.

(24) In this platform:

a recess may be formed in the interconnecting line so that a bottom surface of the recess is exposed from the molded component.

By means of this, at the bottom surface of the recess, the electrical connection of the interconnecting line and other elements can be achieved.

(25) In this platform:

the recess formed in the interconnecting line may be filled with a conductive material.

By means of this, the interconnecting line and other elements can be electrically connected through the conductive material.

(26) In this platform:

an electronic component electrically connected to the interconnecting line may be incorporated in the molded component.

By means of this, a platform incorporating an electronic component can be obtained.

(27) An optical module of the embodiments according to the present invention includes:

the above described platform; and an optical element electrically connected to the interconnecting line and mounted over the platform.

According to this embodiment, the optical element is mounted over the platform in which projections are not formed by the interconnecting line. The interconnecting line is protected by being embedded in the resin molded component.

(28) In this optical module:

the optical element may be mounted in the indent so as to face the one end surface of the optical fiber; and a semiconductor chip, which is mounted so as to face a surface of the optical element opposite to a surface facing the optical fiber, and is electrically connected to the interconnecting line, may be included in the indent.

According to this embodiment, the indent has a multiply stepped form, and an optical element or semiconductor chip or the like can be contained in the indent in a compact way.

(29) The optical module may further comprise a resin sealing the optical element.

By means of this, the optical element can be protected.

(30) In this optical module:

at least between the optical fiber and the optical element, a resin having a light transmitting property may be formed as the resin.

(31) An optical transmission device according to the embodiments of the present invention includes:

the above described plurality of platforms;

an optical element mounted over each of the platforms; and the optical fiber attached to each of the platforms, wherein the optical element is a light-receiving element or a light-emitting element, and wherein the optical element is electrically connected to the exposed part of the interconnecting line.

According to this embodiment, the optical element is mounted over the platform in which projections are not formed by the interconnecting line. The interconnecting line is protected by being embedded in the resin molded component.

(32) In this optical transmission device:

a semiconductor chip mounted over each of the platforms may be further provided, the optical element may be mounted in the indent so as to face the one end surface of the optical fiber, and the semiconductor chip may be electrically connected to the interconnecting line, and may be mounted within the indent so as to face a surface of the optical element opposite to a surface facing the optical fiber.

By means of this, the indent has a multiply stepped form, and an optical element or semiconductor chip or the like can be contained in the indent in a compact way.

(33) The optical transmission device may further comprise a resin which seals the optical element.

By means of this, the optical element can be protected.

(34) In this optical transmission device:

at least between the optical fiber and the optical element, a resin having a light transmitting property may be formed as the resin.

(35) This optical transmission device may further comprise: a plug connected to the optical element. The present invention is now described in terms of a number of embodiments, with reference to the drawings.

First Embodiment

FIGS. 1 to 4 show a first embodiment of the method of manufacturing a platform according to the present invention. In this embodiment, a mold 10 shown in FIG. 1 is used.

The mold 10 has on its surface, a first region 12 and a second region 14. For example, on the upper side of the mold 10, the first region 12 is positioned in a central portion of the second region 14. In other words, the second region 14 is positioned around the periphery of the first region 12. The first region 12 may be formed to project more than the second region 14. In that case, as shown in FIG. 1, the first and second regions 12 and 14 are preferably connected by an inclined surface (taper surface) from the second region 14. By means of this form, the molding material 40 described below (see FIG. 3) has good mold release characteristics. Alternatively, the first and second regions 12 and 14 may be connected by a surface rising perpendicularly from the second region 14.

The mold 10 may be formed of resin, glass, ceramic, or metal, but if silicon (for example a silicon wafer) is used, fine machining can be carried out by etching. Depending on the etching conditions, the form of the surface connecting the first and second regions 12 and 14 (taper surface or perpendicular surface) may be determined.

The surface of the first region 12 is formed to be substantially even. The surface of the second region 14 is also formed to be substantially even. In the first region 12 a hole 16 is formed. The hole 16 accepts the end of an optical fiber 30 described below (see FIG. 2), fills a positioning role. Therefore, the hole 16 is preferably precisely formed. When the mold 10 is formed of silicon, the hole 16 can be formed with high precision by etching.

In this embodiment, as shown in FIG. 1, the mold 10 is provided with interconnecting lines 20 and 22. In more detail, the interconnecting lines 20 and 22 are provided with their ends adhered to the first and second regions 12 and 14.

The interconnecting line 20 shown in FIG. 1 is formed by bonding both ends of a wire to the first and second regions 12 and 14. It should be noted that in the first region 12, the wire is bonded to avoid the hole 16. The wire may be bonded by the wire bond used in the fabrication of a semiconductor device. In that case, bonding is carried out by means of at least one of heat, pressure, and ultrasonic vibration. The wire may be of gold or aluminum.

When the mold 10 is formed of a material such as silicon or the like to which the metal of which the wire is formed does not adhere easily, a bonding pad 24 is preferably previously formed on the mold 10. The bonding pad 24 may be a conducting film or if not electrically conducting, a film such that the wire can be attached. In this case, the wire and bonding pad 24 integrally form the interconnecting line 20. The surface of the bonding pad 24 may be formed of the same material as the wire. For example, when the wire is of gold, the bonding pad 24 may be formed of a film of chromium, with a film of gold formed thereon.

The interconnecting line 22 shown in FIG. 1 is a conductive layer. The conductive layer may be a metal foil formed by vapor deposition or plating. When electroless plating is applied as the plating, a catalyst may be applied using inkjet technology. The conductive layer may be formed by the application of printing, potting, or inkjet technology. The material of the conductive layer may be a conducting paste. The interconnecting line 22 if formed of metal foil may be adhered to the mold 10 for its entire length. The interconnecting line 22 if formed of conducting paste may have an end adhered to the first region 12, an intermediate portion in a floating state, and the other end adhered to the second region 14.

The interconnecting lines 20 and 22 are preferably easily released from the mold 10. For example, if the interconnecting line 22 is formed by plating with tin or the like, it will be easily released. If the interconnecting line 22 is formed by printing, the interconnecting line 22 can be relatively easily released.

Figure 2:
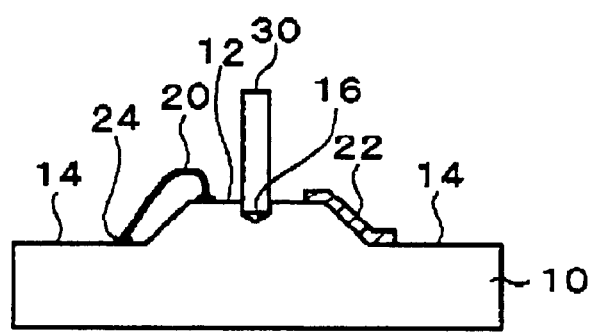
FIG. 2 shows a first embodiment of the method of manufacturing a platform according to the present invention.

Next, as shown in FIG. 2, the optical fiber 30 is disposed with its end facing the mold 10. For example, the end of the optical fiber 30 may be inserted into the hole 16 formed in the mold 10. By means of this, the optical fiber 30 can be positioned by the hole 16.

The optical fiber 30 includes a core surrounded by a concentric circular cladding, and light is reflected by the boundary between the core and the cladding, to be contained within the core and thus transmitted. Around the periphery, the cladding is commonly protected by a jacket.

If required, a mold release agent (not shown in the drawings) is applied to the mold 10. The mold release agent (lubricant) has low adhesion with the molding material 40 described below, and by applying the mold release agent, the mold release characteristics from the mold 10 of the molding material 40 are improved.

Figure 3:
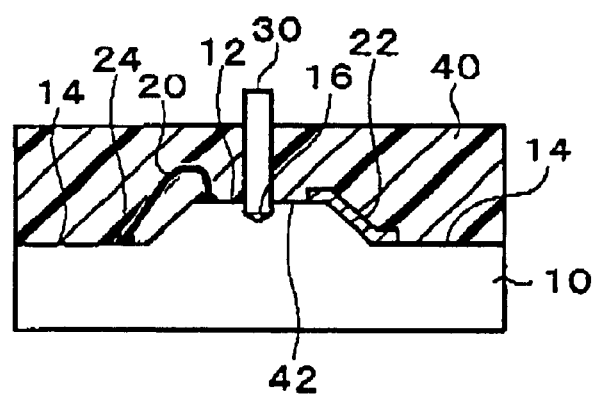
FIG. 3 shows a first embodiment of the method of manufacturing a platform according to the present invention.

As shown in FIG. 3, the molding material 40 seals the interconnecting lines 20 and 22 and the optical fiber 30. The interconnecting line 20 formed by wire bonding is sealed by the forming resin 40, whereby disconnection in the wire is prevented. Except for the surface of contact with the mold 10, the interconnecting line 22 formed of the conductive layer is covered by the molding material 40.

The molding material 40 may be a molding resin. In this case, the cavity formed by the mold 10 and another mold not shown in the drawing is filled with the molding material 40. Alternatively, the molding material 40 may be provided by potting.

The molding material 40 is provided to avoid the end surface of the optical fiber 30. By inserting the end of the optical fiber 30 in the hole 16, the molding material 40 is prevented from covering the end surface of the optical fiber 30. The hole 16 is preferably of the minimum depth required for positioning the optical fiber 30. In particular, the hole 16 is preferably formed with a depth to extend below the surface of the second region 14.

A part of the surface form of the molding material 40 is shaped by lateral surfaces of the first and second regions 12 and 14 of the mold 10. In more detail, since the first region 12 projects more than the second region 14, an indent 42 is formed in the molding material 40. A mold release agent may be mixed with the molding material 40, and the mold release characteristics from the mold 10 improved. It should be noted that if the molding material 40 is a molding resin, the surface thereof is shaped also by the other mold (not shown in the drawings) used with the mold 10 to form a cavity.

Figure 4:
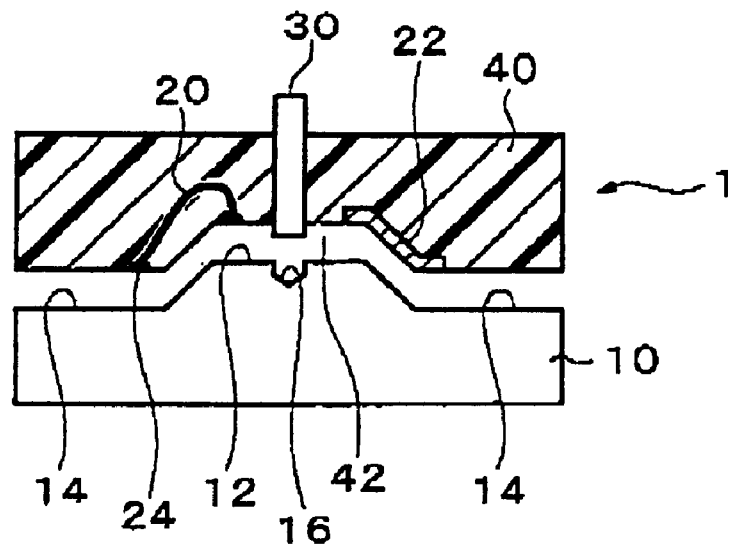
FIG. 4 shows a first embodiment of the method of manufacturing a platform according to the present invention.

Next, as shown in FIG. 4, the molding material 40 is cured, and released from the mold 10. At this time, the optical fiber 30 is integrally fixed to the molding material 40. Together with the molding material 40, the surfaces of the interconnecting lines 20 and 22 in contact with the mold 10 are released from the mold 10. The interconnecting line 20 has the end surface of the wire and the surface of the bonding pad 24 released from the mold 10. The interconnecting line 22 formed of a conductive layer is in contact with the mold 10 over its whole length, and therefore is released from the mold 10 over the whole length of its surface.

In this way a platform 1 is obtained. The platform 1 has a molded component formed from the molding material (for example resin) 40. In the molded component is formed the indent 42. The indent 42 is preferably of a size to contain the optical element 50 (see FIG. 5). If the inner wall of the indent 42 has a taper, the optical element 50 can be inserted more easily. The interconnecting lines 20 and 22 are embedded in the molded component with a part exposed. The interconnecting line 20 has the surface of the end of the wire or the surface of the bonding pad 24 to which the wire is bonded exposed from the molded component. The interconnecting line 22 is exposed along the entire length of its surface. The interconnecting lines 20 and 22 are exposed in interior surface (bottom surface) of the indent 42 and on the periphery of the indent 42. That is to say, the interconnecting lines 20 and 22 have a first exposed portion on the surface formed in the first region 12 of the mold 10 described above, and a second exposed portion on the surface formed in the second region 14 of the mold 10.

The optical fiber 30 is fixed to the molded component with its end surface exposed. In more detail, within the indent 42 formed in the molded component, the optical fiber 30 is fixed with its end surface exposed. The end of the optical fiber 30 projects from the bottom surface of the indent 42. The length of this projection is preferably a length such as not to contact the optical part of the optical element 50.

Figure 5:
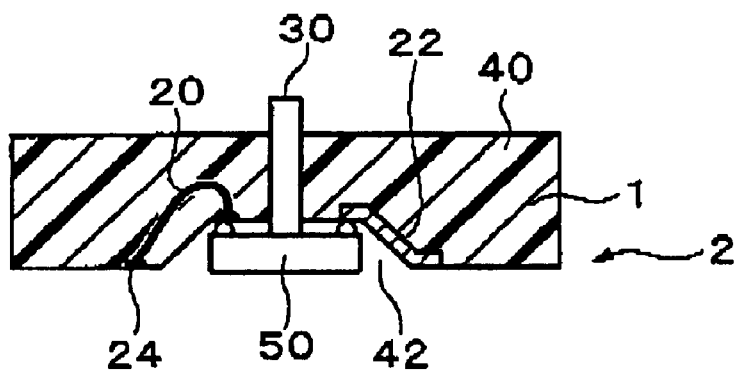
FIG. 5 shows a first embodiment of the method of manufacturing an optical module according to the present invention.

Next, as shown in FIG. 5, the optical element 50 is mounted on the platform 1. The optical element 50 may equally be a light-emitting element or a light-receiving element. As an example of a light-emitting element, a surface light-emitting element, and particularly a surface light-emitting laser can be used. A surface light-emitting element such as a surface light-emitting laser or the like emits light perpendicularly from the surface. The optical element 50 has an optical part not shown in the drawings. When the optical element 50 is a light-emitting element, the optical part is a light-emitting part, and when the optical element 50 is a light-receiving element, the optical part is a light-receiving part.

The optical element 50 commonly has electrodes formed on the side on which the optical part is formed and on the side opposite thereto. That is to say, the optical element 50 has electrodes formed on front and rear surfaces, and a voltage is applied between the electrodes. It should be noted that the optical element 50 shown in FIG. 5 has a bump (or solder ball or the like) formed on the electrode formed on the side on which the optical part is formed.

As shown in FIG. 5, the optical element 50 is mounted in the indent 42 formed in the platform 1. The optical element 50 may be contained within the depth of the indent 42. The optical element 50 is mounted on the platform 1 with optical part not shown in the drawings facing the exposed end surface of the optical fiber 30. Then the electrode on the side on which the optical part is formed and the exposed portion of the interconnecting lines 20 and 22 of the platform 1 are electrically connected (or bonded).

In this way, the optical module 2 shown in FIG. 5 is obtained. The optical module 2 has the electrode of the optical element 50 on the side on which the optical part is formed electrically connected to the first exposed portion of the interconnecting lines 20 and 22 (the exposed portion within the indent 42). Therefore, electrical connection to the optical element 50 can be achieved from the second exposed portion of the interconnecting lines 20 and 22 (the exposed portion formed around the periphery of the indent 42 in the platform 1). On the rear surface of the optical element 50 (the surface opposite to the surface on which the optical part is formed) also, an electrode not shown in the drawings is formed. From the above, the optical module 2 has a plurality of external terminals (electrode on the side of the optical element 50 opposite to the optical part and the second exposed portion of the interconnecting lines 20 and 22) on the surface on the opposite side to the direction in which the direction in which the optical fiber 30 is brought out so that a voltage can be applied to the optical element 50.

Figure 6:
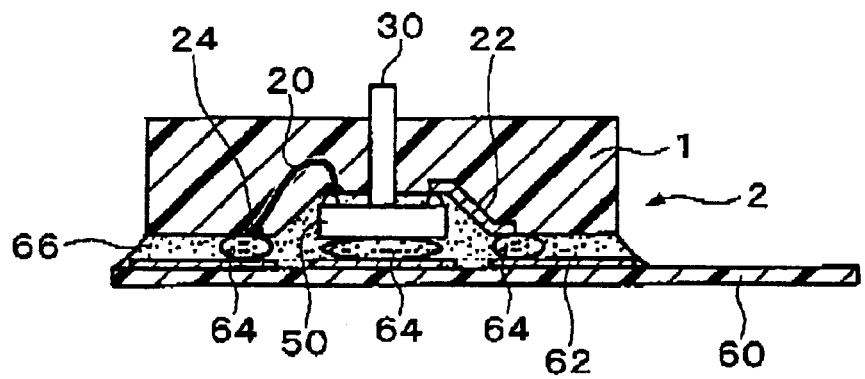
FIG. 6 shows a first embodiment of the method of manufacturing an optical module according to the present invention.

As shown in FIG. 6, the optical module 2 may be attached to a substrate 60. On the substrate 60, the interconnecting line pattern 62 is formed. The plurality of external terminals of the optical module 2 (electrode on the side of the optical element 50 opposite to the optical part, and the second exposed portion of the interconnecting lines 20 and 22) and the interconnecting line pattern 62 are electrically connected by a conductive material 64. The conductive material 64 may be a brazing material such as solder or the like, or a conducting paste, or may be an anisotropic conducting film or anisotropic conducting paste.

A resin 66 for sealing the optical element 50 is preferably provided. In the example shown in FIG. 6, the resin 66 is provided between the substrate 60 and the optical module 2, and therefore is an underfill. If a gap is formed between the optical part of the optical element 50 (not shown in the drawings) and the end surface of the optical fiber 30, at least the resin 66 with which this gap is filled is a transparent resin. When the optical part of the optical element 50 (not shown in the drawings) and the end surface of the optical fiber 30 are in intimate contact, the resin 66 need not be light-transmitting.

Figure 7:
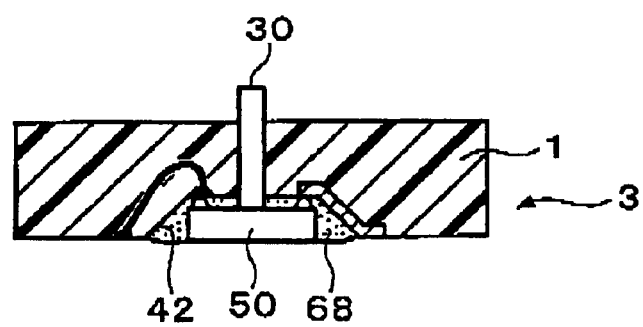
FIG. 7 shows a first embodiment of the method of manufacturing an optical module according to the present invention.

FIG. 7 shows another example, an optical module 3. The optical module 3 has the indent 42 formed in the platform 1 filled with a resin 68. If a gap is formed between the optical part of the optical element 50 (not shown in the drawings) and the end surface of the optical fiber 30, at least the resin 68 with which this gap is filled is a transparent resin. When the optical part of the optical element 50 (not shown in the drawings) and the end surface of the optical fiber 30 are in intimate contact, resin 68 need not be light-transmitting.

Figure 8:
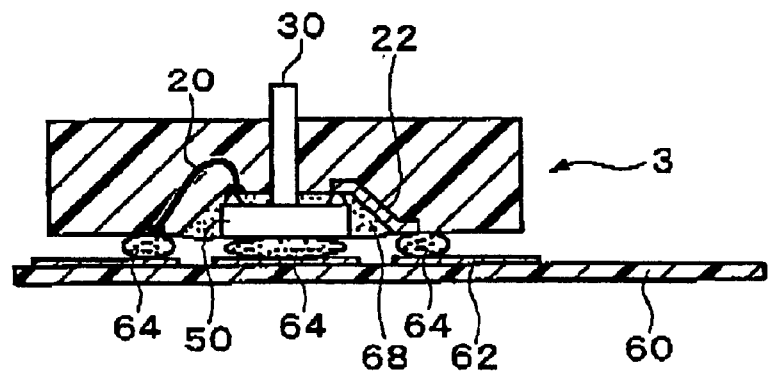
FIG. 8 shows a first embodiment of the method of manufacturing an optical module according to the present invention.

The optical module 3 shown in FIG. 7 may, as shown in FIG. 8, be mounted on the substrate 60. On the substrate 60, the interconnecting line pattern 62 is formed. The optical module 3 and interconnecting line pattern 62 are electrically connected. The optical module 3 has the optical element 50 sealed by the resin 68, and after attachment to the substrate 60, while filling with an underfill material is not necessarily required, such filling may be done. If the conductive material 64 is a conducting adhesive, the electrical connection and adhesion can be carried out simultaneously.

As described above, according to this embodiment, the platform 1 can be formed by a simple process, and as a result of this process, projections are not formed on the platform 1 by the interconnecting lines 20 and 22. The optical modules 2 and 3 having the platform 1 have the interconnecting lines 20 and 22, but a portion of the flat surface forms the electrical connection portions (exposed portions). Therefore, the process of attaching the optical modules 2 and 3 to the substrate 60 can be carried out easily.

Second Embodiment

Figure 9:
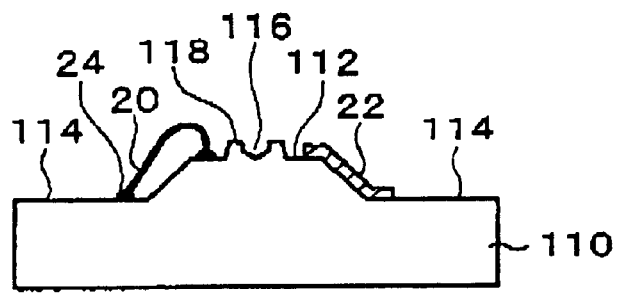
FIG. 9 shows a second embodiment of the method of manufacturing a platform according to the present invention.

FIGS. 9 to 12 show a second embodiment of the method of manufacturing a platform according to the present invention. In this embodiment, a mold 110 shown in FIG. 9 is used.

The mold 110 has on its surface a first region 112 and a second region 114. In the first region 112, a projected portion 118 is formed, having a hole 116 formed in its upper surface.

The projected portion 118 is formed of a size to leave remaining a region of the first region 112 to contact the interconnecting lines 20 and 22. The upper surface of the projected portion 118 may be flat, or may have a relief texture, or be a rough surface.

The hole 116, like the hole 16 shown in FIG. 1, has the end of the optical fiber 30 inserted, for positioning thereof. The hole 116 is preferably shallower than the height of the first region 112. In more detail, the depth of the hole 116 is preferably made such that when the end of the optical fiber 30 is inserted into the hole 116, the end surface of the optical fiber 30 is positioned above the surface of the first region 112.

In other aspects of the construction of the mold 110, the description of the mold 10 shown in FIG. 1 apply.

In this embodiment, as shown in FIG. 9, the mold 110 is provided with interconnecting lines 20 and 22. The details thereof are the same as in the first embodiment, and description is therefore omitted here.

Figure 10:
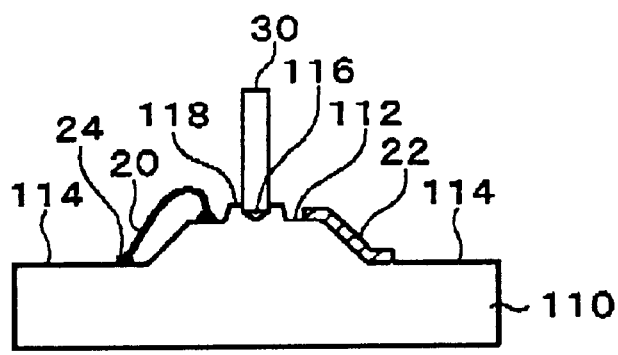
FIG. 10 shows a second embodiment of the method of manufacturing a platform according to the present invention.

Next, as shown in FIG. 10, the optical fiber 30 is disposed with its end facing the mold 110. The details thereof are the same as in the first embodiment, and description is therefore omitted here.

Figure 11:
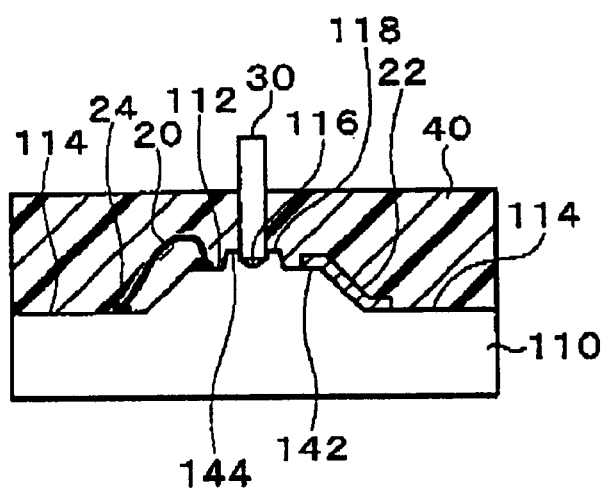
FIG. 11 shows a second embodiment of the method of manufacturing a platform according to the present invention.

Then, as shown in FIG. 11, the molding material 40 seals the interconnecting lines 20 and 22 and the optical fiber 30. A part of the surface form of the molding material 40 is shaped by lateral surfaces of the first and second regions 112 and 114 of the mold 110. The details thereof are the same as in the first embodiment, and description is therefore omitted here.

In this embodiment, in the first region 112 the projected portion 118 is formed, and therefore in the molding material 40 a recess 144 is formed. In more detail, in the molding material 40 an indent 142 is formed, and within the indent 142 the recess 144 is formed.

Figure 12:
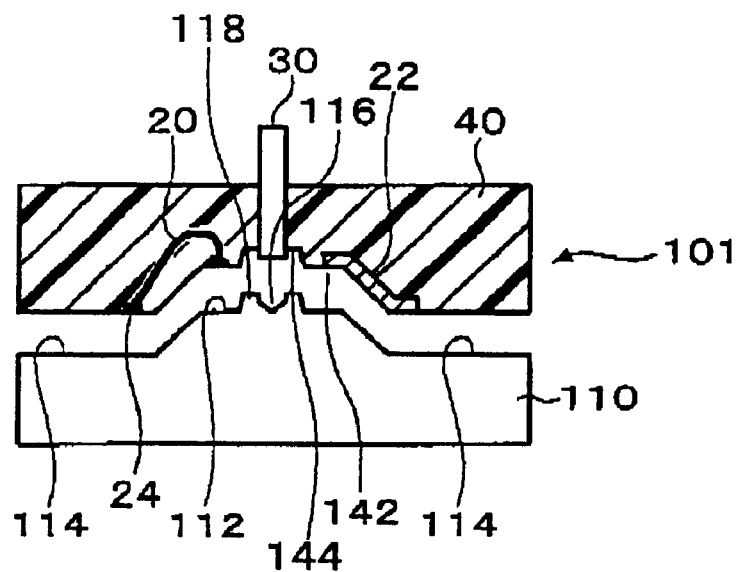
FIG. 12 shows a second embodiment of the method of manufacturing a platform according to the present invention.

Next, as shown in FIG. 12, the molding material 40 is cured and removed from the mold 110. At this time, the optical fiber 30 is integrally fixed to the molding material 40.

The optical fiber 30 is fixed within the recess 144. The end surface of the optical fiber 30 preferably does not project from the bottom surface of the indent 142 (the surface formed by the first region 112 of the mold 110). By means of this, contact with the optical part of the optical element 50 by the end of the optical fiber 30 is avoided. For this purpose, as shown in FIG. 10, when the optical fiber 30 is inserted into the hole 116 of the mold 110, The hole 116 is made to be of such a form that the end surface of the optical fiber 30 is not deeper than the surface of the first region 112. In other details, the description of the first embodiment applies.

In this way, a platform 101 is obtained. The platform 101 has a molded component formed from the molding material (for example resin) 40. In the molded component, the indent 142 is formed. The end surface of the optical fiber 30 is arranged not to project from the bottom surface of the indent 142. In other aspects of the construction, the description of the first embodiment applies.

Figure 13:
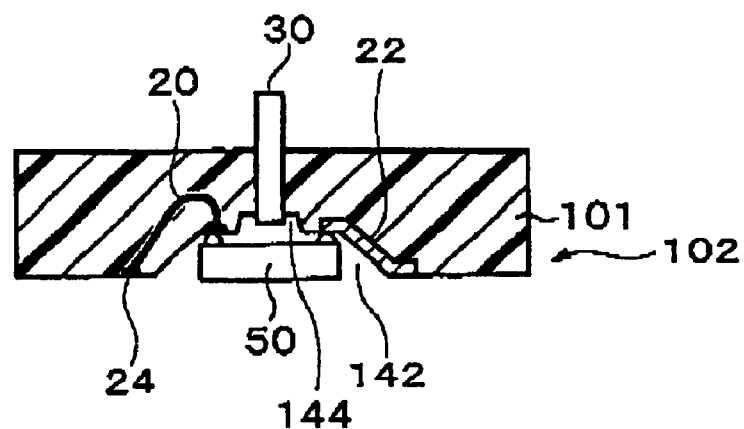
FIG. 13 shows a second embodiment of the method of manufacturing an optical module according to the present invention.

Next, as shown in FIG. 13, the optical element 50 is mounted on the platform 101, and an optical module 102 is obtained. Other details are as described in the first embodiment. The end of the optical fiber 30 does not project from the surface of the platform 101 on which the optical element 50 is mounted, and therefore the optical fiber 30 does not touch the optical part of the optical element 50.

Figure 14:
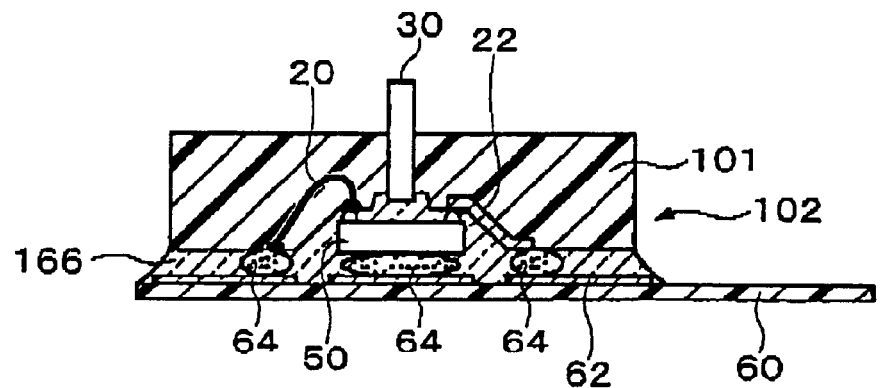
FIG. 14 shows a second embodiment of the method of manufacturing an optical module according to the present invention.

As shown in FIG. 14, the optical module 102 may be attached to a substrate 60. A resin 166 for sealing the optical element 50 is preferably provided. In the example shown in FIG. 14, the resin 166 is provided between the substrate 60 and the optical module 102, and is thus an underfill. Since a cavity (the recess 144) is formed between the optical part of the optical element 50 (not shown in the drawings) and the end surface of the optical fiber 30, at least in the portion with which this gap is filled, the resin 166 is a transparent resin. In other details, the description of the first embodiment applies.

Figure 15:
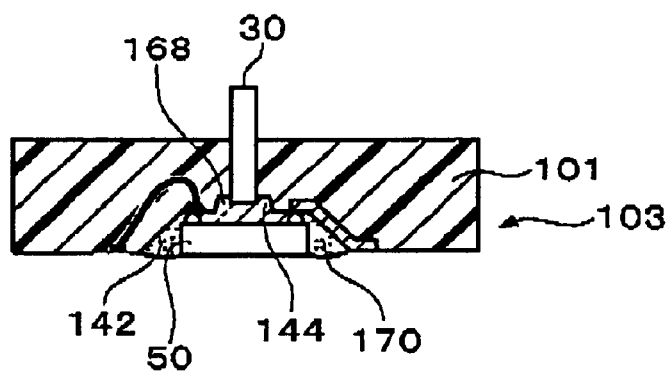
FIG. 15 shows a second embodiment of the method of manufacturing an optical module according to the present invention.

FIG. 15 shows a different example of an optical module 103. The optical module 103 has the indent 142 formed in the platform 101 filled with resin 168, 170. Since a cavity (the recess 144) is formed between the optical part of the optical element 50 (not shown in the drawings) and the end surface of the optical fiber 30, at least the resin 168 with which this gap is filled is a transparent resin, and the resin 170 with which the remaining region (the indent 142) is filled may be a resin not transmitting light.

Figure 16:
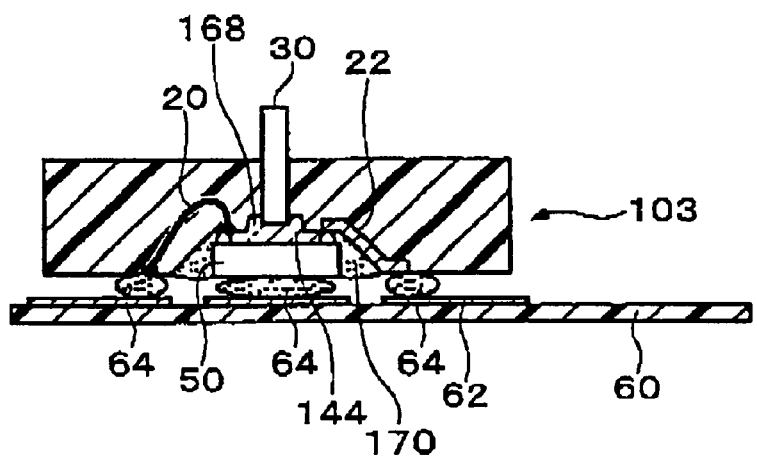
FIG. 16 shows a second embodiment of the method of manufacturing an optical module according to the present invention.

The optical module 103 shown in FIG. 15, as shown in FIG. 16, may be mounted on the substrate 60. Other details are as described in the first embodiment.

As described above, according to this embodiment, the optical fiber 30 does not project from the bottom surface of the indent 142, which is the surface of the platform 101 on which the optical element 50 is mounted. Therefore, the optical fiber 30 can be prevented from contacting the optical part of the optical element 50. Other resultant effects are as described in the first embodiment.

Third Embodiment

Figure 17:
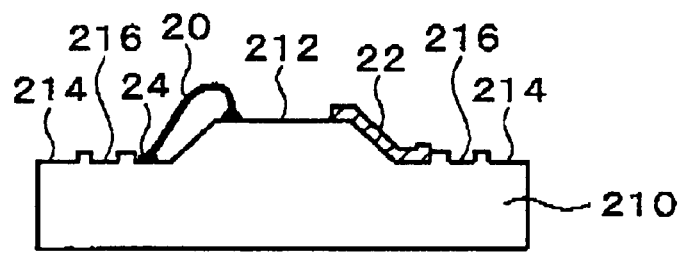
FIG. 17 shows a third embodiment of the method of manufacturing a platform according to the present invention.

FIGS. 17 to 20 show a third embodiment of the method of manufacturing a platform according to the present invention. In this embodiment, a mold 210 shown in FIG. 17 is used.

The mold 210 has on its surface a first region 212 and a second region 214. In the second region 214, a guide 216 for attaching the support member 220 described below is formed. As shown in FIG. 17, a projection or wall may be formed in the second region 214, to delineate a region as the guide 216, or a hole or recess may be formed in the second region 214 as the guide 216.

In other aspects of the construction of the mold 210, the description of the mold 10 shown in FIG. 1 applies. In this embodiment, as shown in FIG. 17, the mold 210 is provided with interconnecting lines 20 and 22. The details thereof are the same as in the first embodiment, and description is therefore omitted here.

Figure 18:
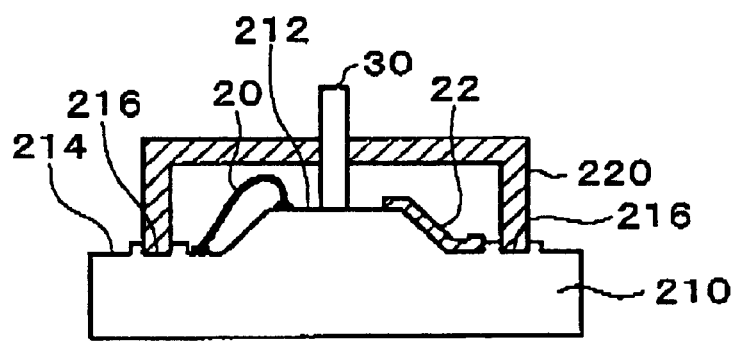
FIG. 18 shows a third embodiment of the method of manufacturing a platform according to the present invention.

Next, as shown in FIG. 18, the support member 220 is attached to the mold 210. The support member 220 positions and supports the optical fiber 30. For example, a hole is formed in the support member 220 through which the optical fiber 30 is passed. Since the position of the support member 220 and mold 210 is determined accurately by the guide 216, the optical fiber 30 can be positioned accurately with respect to the mold 210.

If the support member 220 is formed of resin, the resin preferably has the same coefficient of thermal expansion as the molding material 40. If the support member 220 is formed of a material with high thermal conductivity, such as a metal, the heat dissipation of the support member 220 can be raised. The support member 220 may be formed of a material of high electrical conductivity, such as a metal, and the support member 220 may be connected to a constant potential (ground potential).

Then as shown in FIG. 18, the optical fiber 30 is disposed with its end facing the mold 210. Since no hole is formed in the first region 212 of the mold 210, the optical fiber 30 is preferably disposed with its end surface in contact or intimate contact with the surface of the first region 212.

Figure 19:
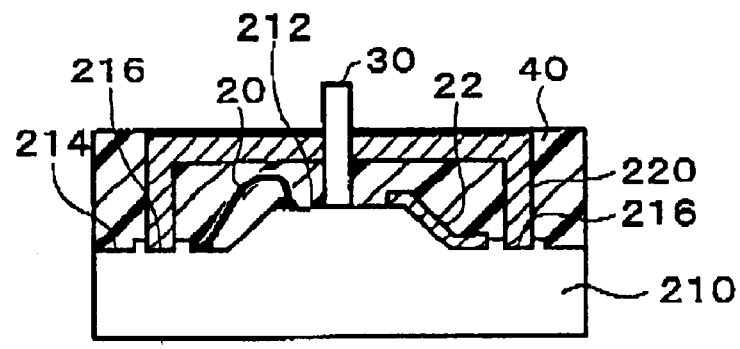
FIG. 19 shows a third embodiment of the method of manufacturing a platform according to the present invention.

Then as shown in FIG. 19, the molding material 40 seals the interconnecting lines 20 and 22 and the optical fiber 30. The support member 220 is also sealed with the molding material 40. A part of the surface form of the molding material 40 is shaped by lateral surfaces of the first and second regions 212 and 214 of the mold 210. The details thereof are the same as in the first embodiment, and description is therefore omitted here.

Figure 20:
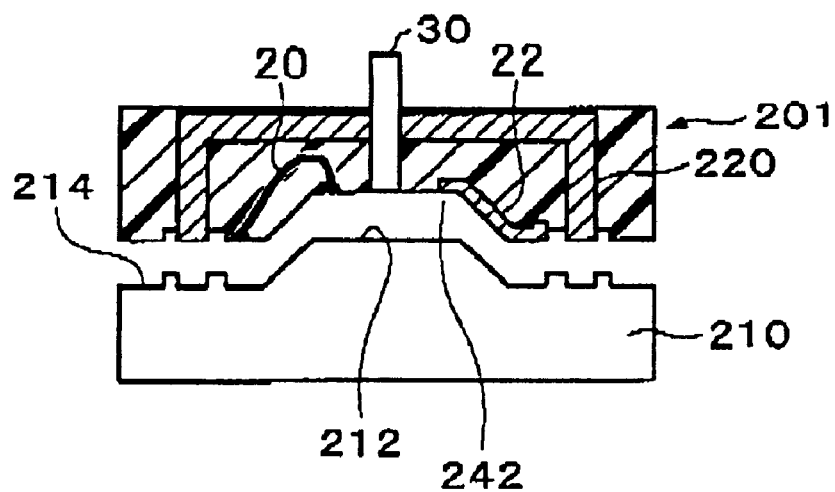
FIG. 20 shows a third embodiment of the method of manufacturing a platform according to the present invention.

Next, as shown in FIG. 20, the molding material 40 is cured, and released from the mold 210. At this time, the optical fiber 30 is integrally fixed to the molding material 40.

The bottom surface of the optical fiber 30 is coplanar with the bottom surface of the indent 242 (the surface formed by the first region 212 of the mold 210). In other details, the description of the first embodiment applies.

In this way, a platform 201 is obtained. The platform 201 has a molded component formed from the molding material (for example resin) 40. In the molded component, the indent 242 is formed. The end surface of the optical fiber 30 is coplanar with the bottom surface of the indent 242.

The support member 220 is incorporated into the platform 201. If the thermal conductivity of the support member 220 is high, the heat dissipation of the platform 201 is improved. If the electrical conductivity of the support member 220 is high, the support member 220 may be electrically connected to for example a constant potential. For example, the support member 220 may be connected to ground potential, and electromagnetism which would affect the electrical signals may be passed through the support member 220. For this electrical connection, a part of the support member 220 is preferably exposed. For example, when attached to the mold 210, the surface of the support member 220 contacting the mold 210 is covered by the molding material 40. When the mold 210 has the guide 216 formed, if the end of the support member 220 is inserted into the guide 216, the end is exposed in the platform 201. In other aspects of the construction of the platform 201, the description of the first embodiment applies.

Figure 21:
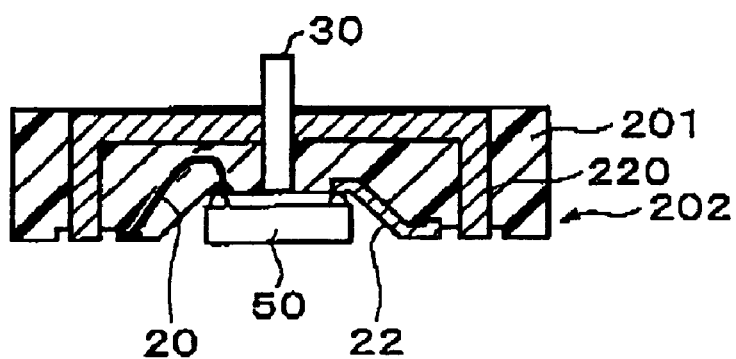
FIG. 21 shows a third embodiment of the method of manufacturing an optical module according to the present invention.

Next, as shown in FIG. 21, the optical element 50 is mounted on the platform 201, and the optical module 202 is obtained. Other details are as described in the first embodiment.

As described above, according to this embodiment, the optical fiber 30 does not project from the bottom surface of the indent 242, which forms the surface of the platform 201 on which the optical element 50 is mounted. Therefore, the optical fiber 30 can be prevented from contacting the optical part of the optical element 50. Other resultant effects are as described in the first embodiment.

Furthermore, the platform 210 incorporates the support member 220, and the support member 220 can be used in a way dependent on the material. The optical module 202 also, as described in the first embodiment, may be attached to the substrate 60, and may be sealed with resin. Other details are as described in the first embodiment.

Fourth Embodiment

Figure 22:
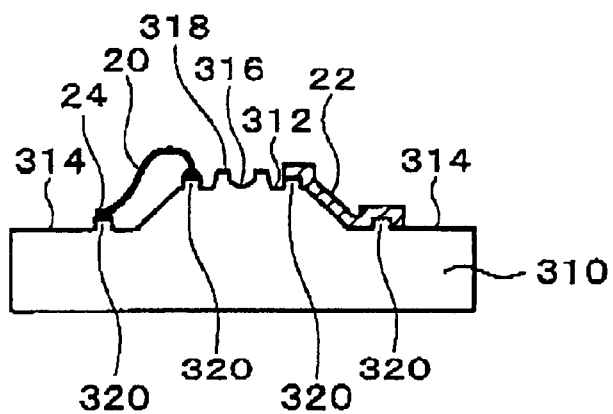
FIG. 22 shows a fourth embodiment of the method of manufacturing a platform according to the present invention.

FIGS. 22 to 25 show a fourth embodiment of the method of manufacturing a platform according to the present invention. In this embodiment, a mold 310 shown in FIG. 22 is used.

The mold 310 has on its surface a first region 312 and a second region 314. In the first region 312 is formed a projected portion 318 in the upper surface of which a hole 316 is formed. The projected portion 318 and hole 316 have the same construction as the projected portion 118 and hole 116 shown in FIG. 9.

The mold 310 has a projection 320. The projection 320 is formed in at least one of the first and second regions 312 and 314 (both in FIG. 22). The projection 320 is in contact with the upper surface of the interconnecting lines 20 and 22. By means of the projection 320, a recess 346 (see FIG. 25) is formed in the molding material 40 exposing the interconnecting lines 20 and 22 to the bottom surface.

In other aspects of the construction of the mold 310, the description of the mold 10 shown in FIG. 1 applies.

In this embodiment, as shown in FIG. 22, the mold 310 is provided with interconnecting lines 20 and 22. In more detail, the interconnecting lines 20 and 22 are provided partially in contact with the projection 320 (for example the upper surface thereof). When a wire is bonded to the projection 320, a bonding pad 24 is first formed on the projection 320. Other details are the same as in the first embodiment, and description is therefore omitted here.

Figure 23:
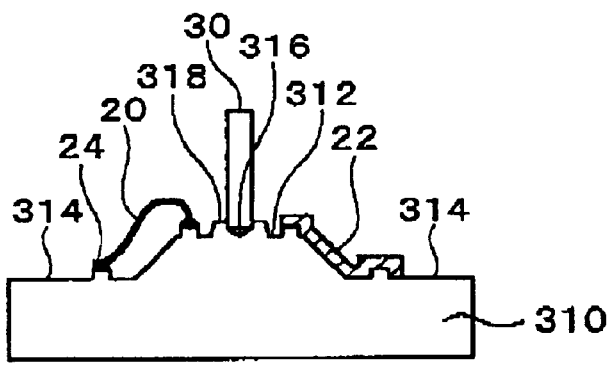
FIG. 23 shows a fourth embodiment of the method of manufacturing a platform according to the present invention.

Next, as shown in FIG. 23, the optical fiber 30 is disposed with its end facing the mold 310. The details thereof are the same as in the embodiment shown in FIG. 10, and description is therefore omitted here.

Figure 24:
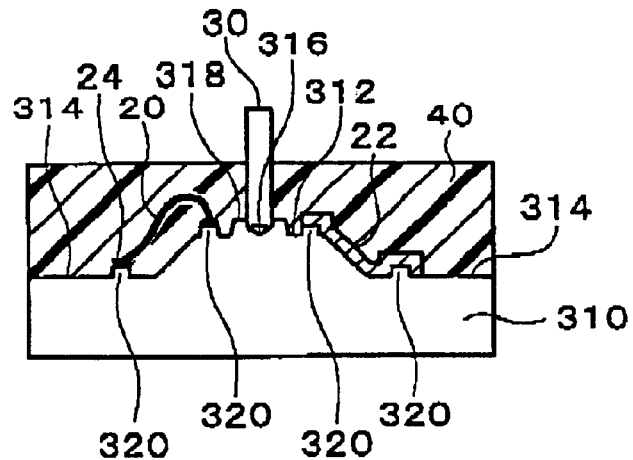
FIG. 24 shows a fourth embodiment of the method of manufacturing a platform according to the present invention.

Then as shown in FIG. 24, the molding material 40 seals the interconnecting lines 20 and 22 and the optical fiber 30. A part of the surface form of the molding material 40 is shaped by lateral surfaces of the first and second regions 312 and 314 of the mold 310. The details thereof are the same as in the embodiment shown in FIG. 11, and description is therefore omitted here.

Figure 25:
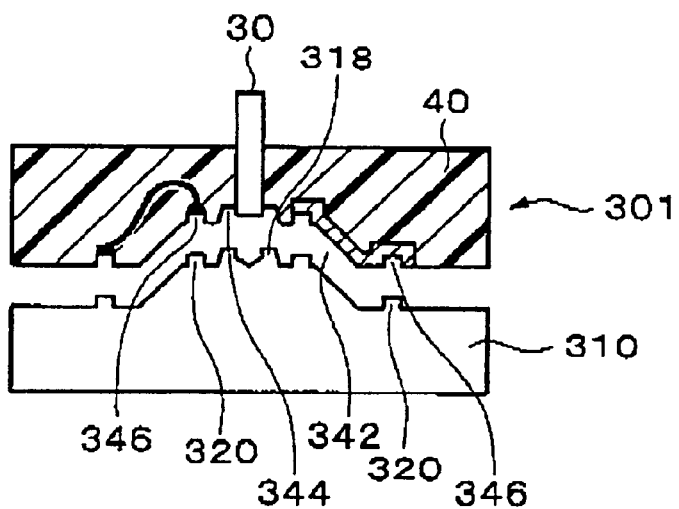
FIG. 25 shows a fourth embodiment of the method of manufacturing a platform according to the present invention.

Next, as shown in FIG. 25, the molding material 40 is cured, and released from the mold 310. At this time, the optical fiber 30 is integrally fixed to the molding material 40. In other details, the description of the second embodiment applies.

In this way, a platform 301 is obtained. The platform 301 has a molded component formed from the molding material (for example resin) 40. In the molded component, an indent 342 is formed. The end of the optical fiber 30 projects into a recess 344 formed in the bottom surface of the indent 342, but the end surface of the optical fiber 30 does not project from the bottom surface of the indent 342.

In the platform 301, a recess 346 is formed so that a part of the interconnecting lines 20 and 22 is exposed in the inner surface (lateral or bottom surface). The recess 346 is formed by the projection 320 of the mold 310. In other aspects of the construction the description of the second embodiment applies.

Figure 26:
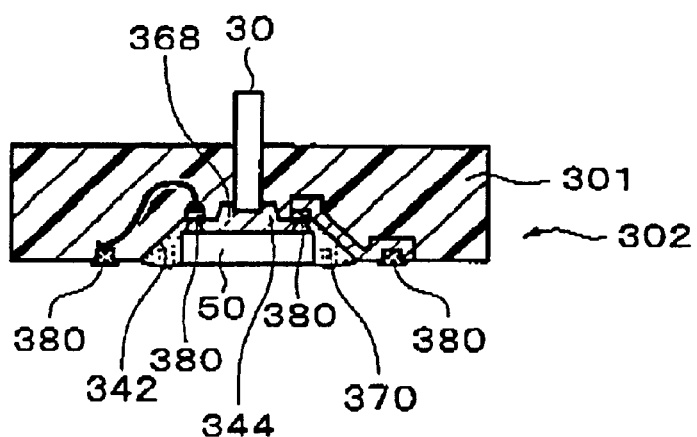
FIG. 26 shows a fourth embodiment of the method of manufacturing an optical module according to the present invention.

Next, as shown in FIG. 26, the optical element 50 is mounted on the platform 301, and an optical module 302 is obtained. The optical module 302 is formed by filling the indent 342 formed in the platform 301 with resin 368, 370. Since a cavity (the recess 344) is formed between the optical part of the optical element 50 (not shown in the drawings) and the end surface of the optical fiber 30, at least the resin 368 with which this gap is filled is a transparent resin, but the resin 370 with which the remaining region (indent 342) is filled may be a resin not transmitting light.

The recess 346 on the inner surface of which the interconnecting lines 20 and 22 are exposed may, as shown in FIG. 26, be filled with a conductive material 380. In this state, a part of the interconnecting lines 20 and 22 is not exposed, but forms a part of the inner surface of the recess 346. The conductive material 380 may be a brazing material such as solder or the like, or may be a conducting paste. In the example shown in FIG. 26, the electrode (bump) of the optical element 50 is bonded to the conductive material 380 with which the recess 346 formed within the indent 342 is filled.

Figure 27:
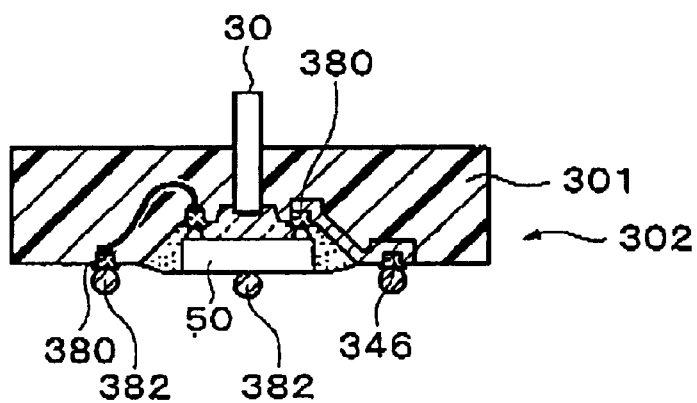
FIG. 27 shows a fourth embodiment of the method of manufacturing an optical module according to the present invention.

As shown in FIG. 27, for the purposes of external electrical connection, the optical module 302 may be provided with external terminals 382 in the form of solder balls or the like. For example, as shown in FIG. 27, on an electrode (not shown in the drawings) formed on the opposite side of the optical element 50 from the optical fiber 30, an external terminal 382 is provided. Around the indent 342, an external terminal 382 is provided on the conductive material 380 with which the recess 346 formed in the platform 301 is filled. As described in the first embodiment, the optical module 302 may be mounted on a substrate.

As described above, according to this embodiment, in addition to the effect described for the second embodiment, since the recess 346 is filled with the conductive material 380, electrical connection is more easily achieved.

Fifth Embodiment

Figure 28:
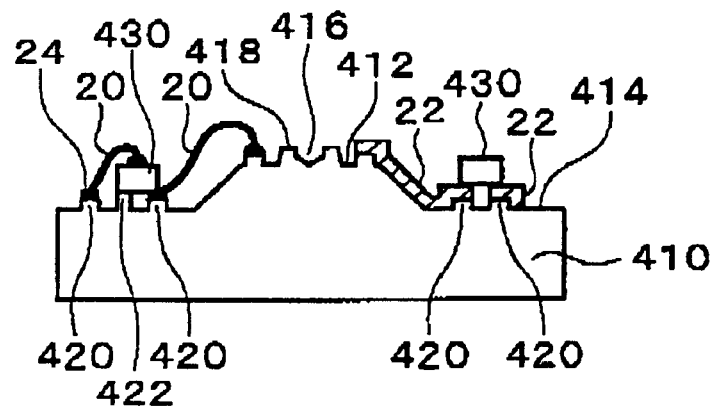
FIG. 28 shows a fifth embodiment of the method of manufacturing a platform according to the present invention.

FIGS. 28 to 31 show a fifth embodiment of the method of manufacturing a platform according to the present invention. In this embodiment, a mold 410 shown in FIG. 28 is used.

The mold 410 has on its surface a first region 412 and a second region 414. In the first region 412, a projected portion 418 with a hole 416 formed in the upper surface is formed. The projected portion 418 and hole 416 have the same construction as the projected portion 118 and hole 116 shown in FIG. 9.

The mold 410 has a projection 420. The projection 420 is formed in at least one of the first and second regions 412 and 414 (both in FIG. 28). The projection 420 serves to put the interconnecting lines 20 and 22 in contact with the surface (for example the upper surface). By means of the projection 420, a recess 446 (see FIG. 31) is formed in the molding material 40, SO that the interconnecting lines 20 and 22 are exposed in the inner surface (bottom surface or side surface). A projection 422 to support an electronic component may be formed without contacting the interconnecting lines 20 and 22.

In other aspects of the construction of the mold 410, the description of the mold 10 shown in FIG. 1 applies. In this embodiment, as shown in FIG. 28, the mold 410 is provided with interconnecting lines 20 and 22. Other details are as described in the fourth embodiment.

Furthermore, an electronic component 430 is mounted on the mold 410. The electronic component 430 is electrically connected to the interconnecting lines 20 and 22. For example, the electronic component 430 may be mounted on the interconnecting lines 20 and 22 in contact with the projection 420, or the interconnecting line 20 may be bonded to the electronic component 430. As examples of the electronic component 430 may be cited a resistor, a capacitor, a coil, an oscillator, a filter, a temperature sensor, a thermistor, a varistor, a variable resistor, a fuse, a Peltier element, or a heat pipe or similar component for cooling.

Figure 29:
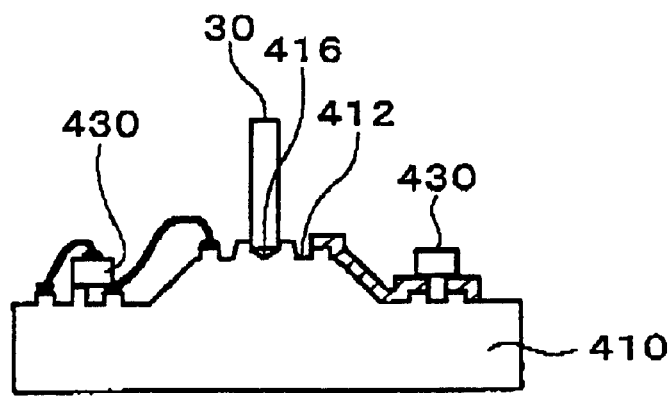
FIG. 29 shows a fifth embodiment of the method of manufacturing a platform according to the present invention.

Next, as shown in FIG. 29, the optical fiber 30 is disposed with its end facing the mold 410. The details thereof are the same as in the embodiment shown in FIG. 10, and description is therefore omitted here.

Figure 30:
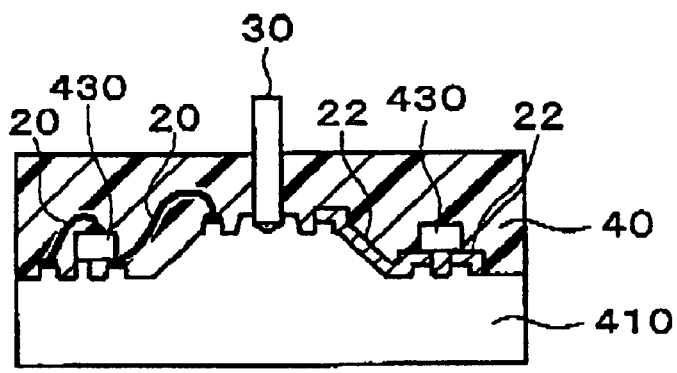
FIG. 30 shows a fifth embodiment of the method of manufacturing a platform according to the present invention.

Then as shown in FIG. 30, the interconnecting lines 20 and 22, the optical fiber 30, and the electronic component 430 are sealed with the molding material 40. The details thereof are the same as in the embodiment shown in FIG. 11, and description is therefore omitted here.

Figure 31:
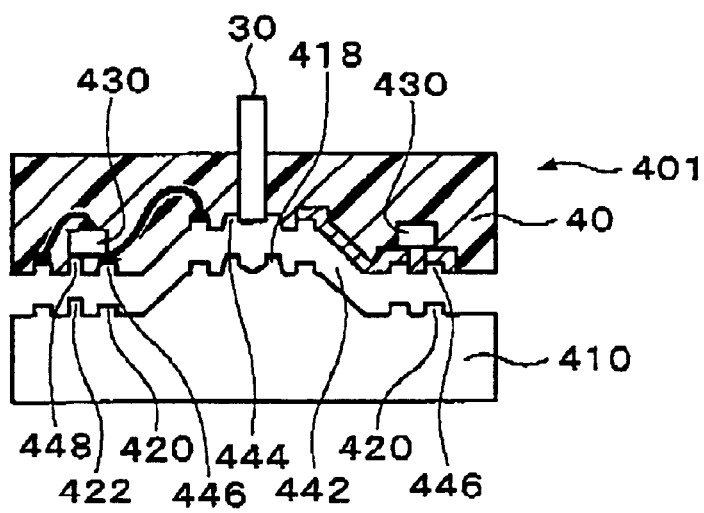
FIG. 31 shows a fifth embodiment of the method of manufacturing a platform according to the present invention.

Next, as shown in FIG. 31, the molding material 40 is cured, and released from the mold 410. In more detail, the description of the second embodiment applies.

In this way, a platform 401 is obtained. The platform 401 has a molded component formed from the molding material (for example resin) 40. In the molded component, an indent 442 is formed. The end of the optical fiber 30 projects within a recess 444, but does not project from the bottom surface of the indent 442.

In the platform 401, a recess 446 is formed so that a part of the interconnecting lines 20 and 22 is exposed in the inner surface (lateral or bottom surface). The recess 446 is formed by the projection 420 of the mold 410. In the platform 401 a recess 448 is formed by projection 422 for supporting the electronic component 430. If an electrode of the electronic component 430 is mounted on the projection 422, within the recess 448 the electrode of the electronic component 430 will be exposed within the recess 448. In other aspects of the construction the description of the second embodiment applies.

Figure 32:
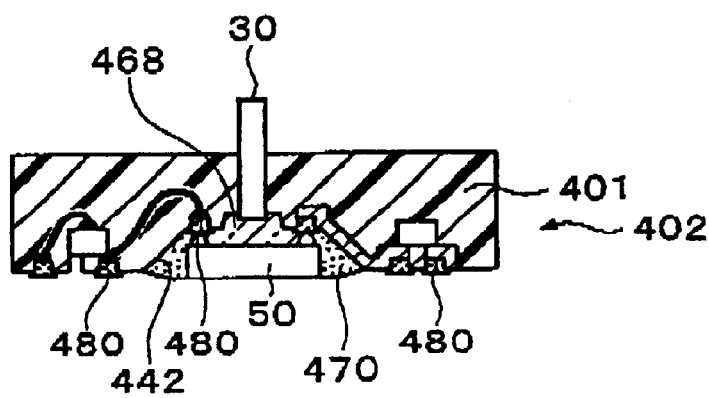
FIG. 32 shows a fifth embodiment of the method of manufacturing an optical module according to the present invention.

As shown in FIG. 32, the optical element 50 is mounted on the platform 401, and an optical module 402 is obtained. The optical module 402 is formed by filling the indent 442 formed in the platform 401 with resin 468, 470. Other details are as described in the fourth embodiment.

The recess 446 may, as shown in FIG. 32, be filled with a conductive material 480. Other details are as described in the fourth embodiment. It should be noted that the recess 448 may also be filled with the conductive material 480.

Figure 33:
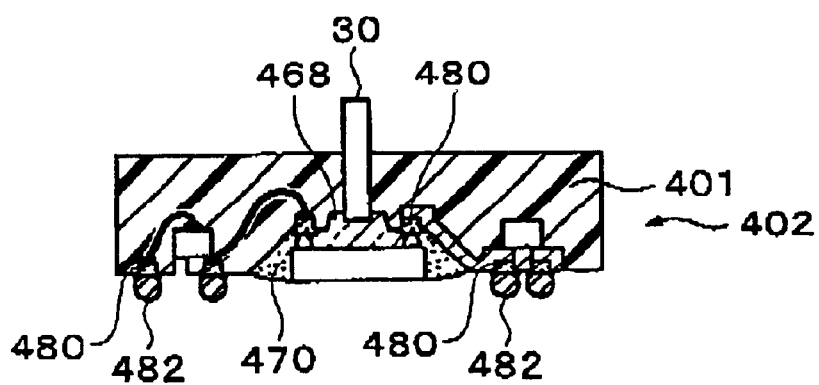
FIG. 33 shows a fifth embodiment of the method of manufacturing an optical module according to the present invention.

As shown in FIG. 33, for the purposes of external electrical connection, the optical module 402 may be provided with external terminals 482 in the form of solder balls or the like. Other details are as described in the fourth embodiment. The optical module 402 may, as described in the first embodiment, be mounted on a substrate.

As described above, according to this embodiment, in addition to the effect described for the second embodiment, since the recess 446 is filled with the conductive material 480, electrical connection is more easily achieved. The platform 401 of this embodiment has the electronic component 430 incorporated, and the electronic component 430 is sealed in the molded component itself, as a result of which stabilized quality can be achieved.

Sixth Embodiment

Figure 34:
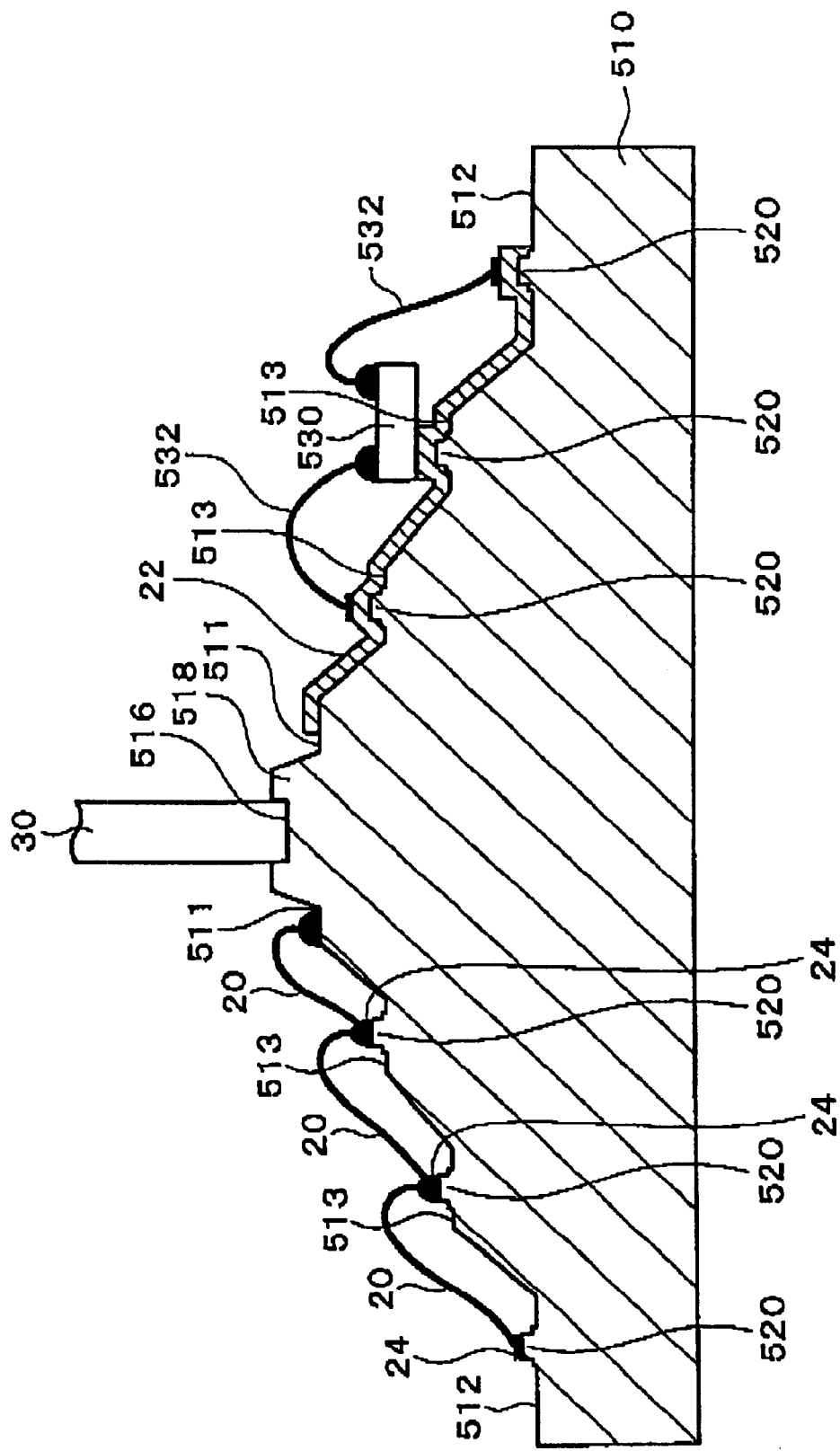
FIG. 34 shows a sixth embodiment of the method of manufacturing a platform according to the present invention.
Figure 35:
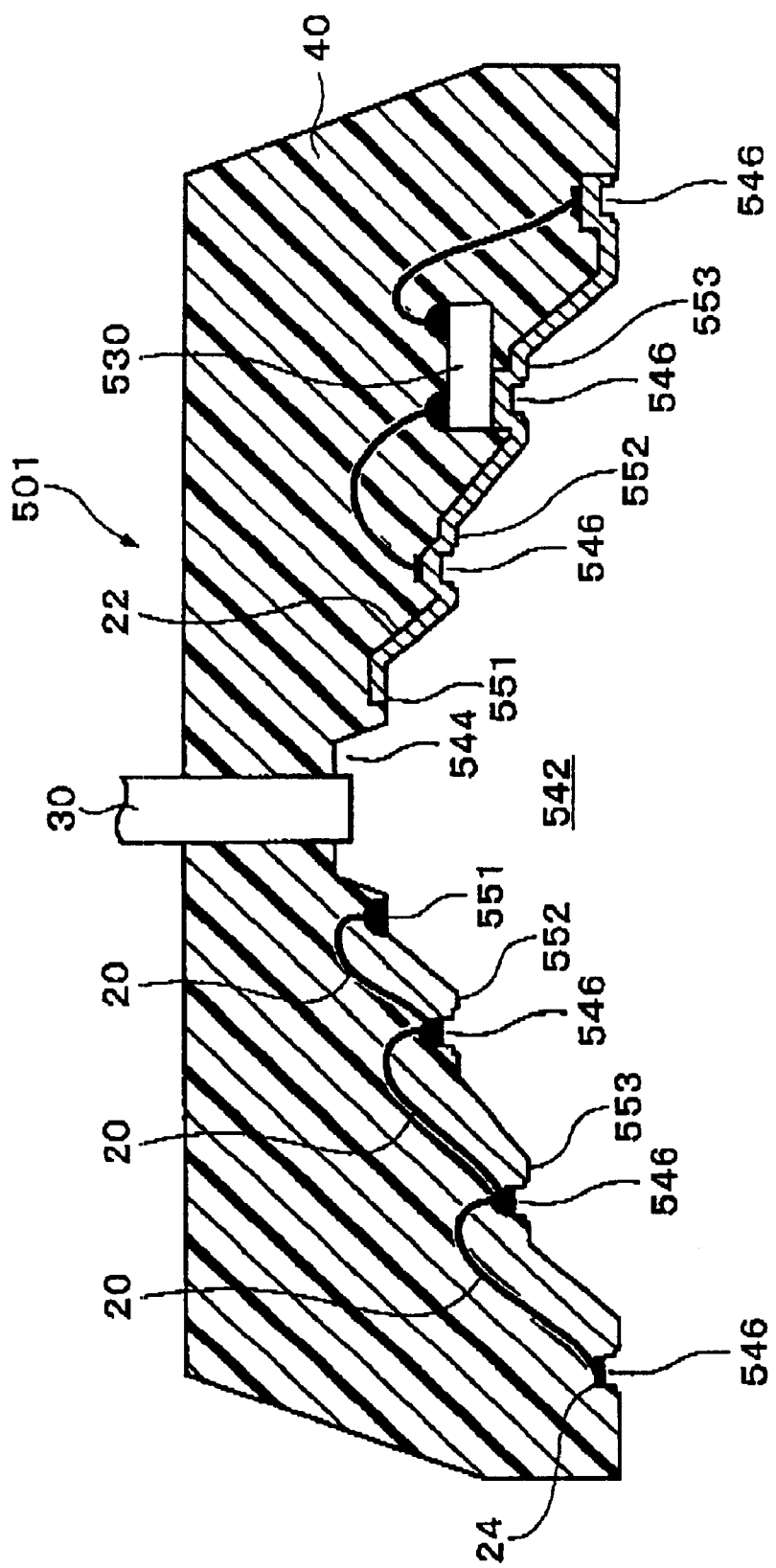
FIG. 35 shows a sixth embodiment of the method of manufacturing a platform according to the present invention.

FIGS. 34 to 35 show a sixth embodiment of the method of manufacturing a platform according to the present invention. In this embodiment, a mold 510 shown in FIG. 34 is used.

The mold 510 has a peaked form, with a plurality of stepped levels, and in plan view, may be circular or rectangular. The mold 510 has a first region 511, a second region 512 positioned lower than the first region 511, and positioned between the heights of the first and second regions 511 and 512 at least one stepped (in FIG. 34, a plurality) third region 513.

In the first region 511, a projected portion 518 having a hole 516 formed in the upper surface is formed. The projected portion 518 and hole 516 have the same construction as the projected portion 118 and hole 116 shown in FIG. 9.

The mold 510 has a projection 520. The projection 520 shown in FIG. 34 is formed in the second and third regions 512 and 513, but may be formed in either one only, or may be formed in the first region 511. The projection 520 serves to put the interconnecting lines 20 and 22 in contact with the surface (for example the upper surface). By means of the projection 520, the concavities 546 (see FIG. 35) are formed in the molding material 40, with the interconnecting lines 20 and 22 exposed on the inner surface (bottom surface or side surface).

In other aspects of the construction of the mold 510, the description of the mold 10 shown in FIG. 1 applies. In this embodiment, as shown in FIG. 34, the mold 510 is provided with interconnecting lines 20 and 22.

For example, a part (for example, one end) of each of a plurality of interconnecting lines 20 is made to be adhered to the first or second region 511 or 512, and another part (for example, the other end) is made to be adhered to the third region 513. Both ends of some interconnecting line 20 are made to contact with the third region 513 in a plurality of steps. Alternatively, skipping the third region 513, an interconnecting line 20 may be made to contact with the first and second regions 511 and 512. It should be noted that before making the interconnecting line 20 contact, as described in the first embodiment, a bonding pad 24 may be formed. Over an interconnecting line 20 contacting with the mold 510, another interconnecting line 20 may be contacted.

Similarly, an interconnecting line 22 is provided, having a part adhered to the first, second and third regions 511, 512, and 513. In the example shown in FIG. 34, an interconnecting line 22 is formed continuously in the first, second and third regions 511, 512, and 513. As an example differing from this, an interconnecting line 22 may be formed between the first and third regions 511 and 513 only, or between the third and second regions 513 and 512 only.

Furthermore, an electronic component 530 may be mounted on the mold 510. The electronic component 530 is electrically connected to the interconnecting lines 20 and 22. For example, the electronic component 530 is mounted on a interconnecting line 22 contacting the projection 520. If required, electrodes of the electronic component 530 and interconnecting lines 20 and 22 may be electrically connected by a wire 532 or the like. Other details are as described in the fifth embodiment.

Next, the optical fiber 30 is disposed with its end facing the mold 510. The details thereof are the same as in the embodiment shown in FIG. 10, and description is therefore omitted here.

Then, the interconnecting lines 20 and 22, the optical fiber 30 and the electronic component 530 are sealed with the molding material 40, and the molded component is released from the mold 510, to form a platform 501 shown in FIG. 35. The details thereof are the same as in the embodiment shown in FIGS. 11 to 12, and description is therefore omitted here.

The platform 501 has a molded component formed from the molding material (for example resin) 40. In the molded component, an indent 542 is formed. Within the indent 542, steps are formed by a plurality of bottom surfaces 551 to 553. In the deepest bottom surface 551, a recess 544 is formed. The end of the optical fiber 30 projects into the recess 544, but the end surface of the optical fiber 30 is such as not to project from the deepest bottom surface 551.

In the bottom surfaces 551 to 553 of the indent 542, a part of the interconnecting lines 20 and 22 is exposed. In the deepest bottom surface 551, the interconnecting lines 20 and 22 are exposed flush with the bottom surface 551. In the bottom surfaces 552 and 553 other than the deepest bottom surface 551, concavities 546 are formed so that a part of the interconnecting lines 20 and 22 is exposed in the inner surface (lateral or bottom surface). The concavities 546 are formed by the projections 520 of the mold 510. The concavities 546 are formed on the periphery of the indent 542, which is the surface of the platform 501.

Figure 36:
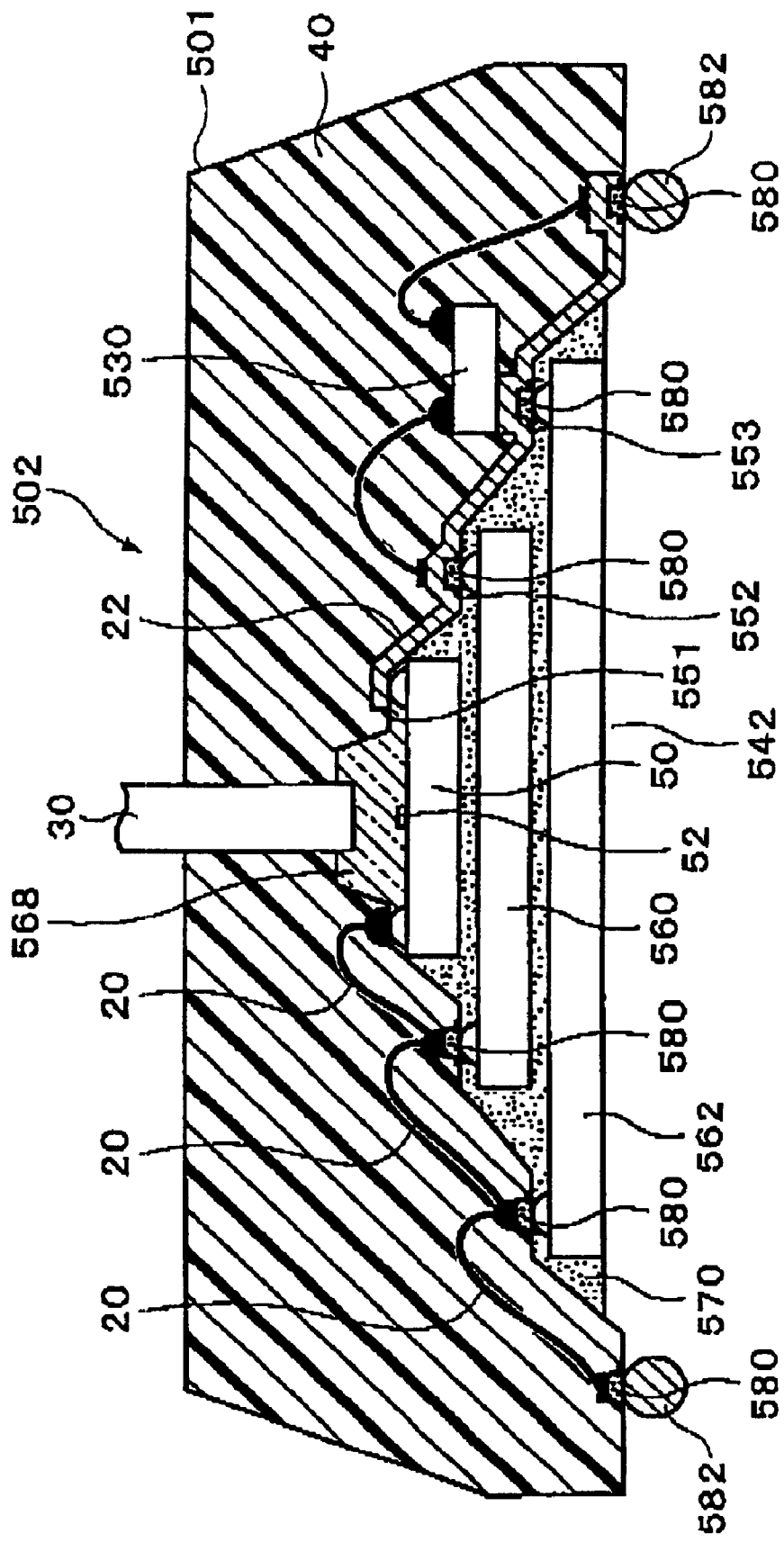
FIG. 36 shows a sixth embodiment of the method of manufacturing an optical module according to the present invention.

The concavities 546 may, as shown in FIG. 36, be filled with a conductive material 580. Other details are as described in the fourth embodiment.

Next, as shown in FIG. 36, the optical element 50 is mounted on the platform 501. In more detail, with an optical part 52 facing the end surface of the optical fiber 30, the optical element 50 is mounted on the deepest bottom surface 551 of the indent 542. The part of the interconnecting lines 20 and 22 exposed on the bottom surface 551 and the electrodes (bumps) of the optical element 50 are electrically connected. For example, facedown bonding is applied.

Between the optical element 50 and the optical fiber 30 is filled with a resin 568. In particular, between the end surface of the optical fiber 30 and the optical part 52 of the optical element 50, the resin 568 is light-transmitting (transparent).

Following on from this, semiconductor chips 560 and 562 are mounted within the indent 542 in positions shallower than the optical element 50. The semiconductor chips 560 and 562 are driver devices for the optical element 50. The semiconductor chips 560 and 562 incorporate circuits for driving the optical element 50. On the semiconductor chips 560 and 562, a plurality of electrodes (or pads) electrically connected to the internal circuitry are formed. It should be noted that in place of the semiconductor chips, a chip formed without the use of semiconductors incorporating the circuits may be applied, and the same effect can be achieved.

The semiconductor chips 560 and 562 are mounted on the bottom surfaces 552 and 553 other than the deepest bottom surface 551. The bottom surfaces 552 and 553 are formed by the third region 513 of the mold 510. The part of the interconnecting lines 20 and 22 exposed in the bottom surfaces 552 and 553 and the electrodes (bumps) of the semiconductor chip 560 are electrically connected. The interconnecting lines 20 and 22 are exposed within the concavities 546 (see FIG. 35) formed in the bottom surfaces 552 and 553. Alternatively, a part of the interconnecting lines 20 and 22 forms a part of the inner wall of the concavities 546 formed in the bottom surfaces 552 and 553 (see FIG. 35).

The optical element 50 and semiconductor chips 560 and 562 are sealed by a resin 570. That is to say, the indent 542 is filled with the resin 570. If the gap between the optical part 52 of the optical element 50 and the end surface of the optical fiber 30 is filled with the transparent resin 568, the resin 570 need not be light-transmitting.

In this way, an optical module 502 is obtained. For the purposes of external electrical connection, the optical module 502 may be provided with external terminals 582 in the form of solder balls or the like. Other details are as described in the fourth embodiment. The optical module 502 may, as described in the first embodiment, be mounted on a substrate.

As described above, according to this embodiment, in addition to the effect described for the other embodiments, the semiconductor chips 560 and 562 can be incorporated in the optical module 502 in a compact way.

Seventh Embodiment

Figure 37:
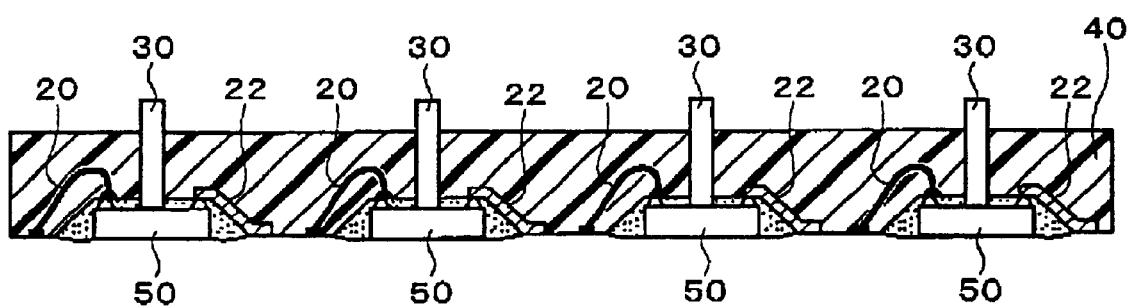
FIG. 37 shows a seventh embodiment of the method of manufacturing an optical module according to the present invention.

FIG. 37 shows a seventh embodiment of an optical module according to the present invention. This optical module includes a plurality of optical elements 50 and a plurality of optical fibers 30. Each optical fiber 30 is provided with a corresponding optical element 50. In the example shown in FIG. 37, the optical module has four optical elements 50, and when these are used to transmit a color image signal, the optical elements 50 and optical fibers 30 are used for transmitting and receiving red, green, and blue signals and a clock signal.

The optical module of this embodiment uses a mold in the form of a number of sets of the mold of the above described other embodiments, and the optical module can be manufactured by the above described methods of manufacture. For example, the optical module shown in FIG. 37 uses a row of four of the mold 10 shown in FIG. 1, and can be manufactured by the method described in the first embodiment.

Eighth Embodiment

Figure 38:
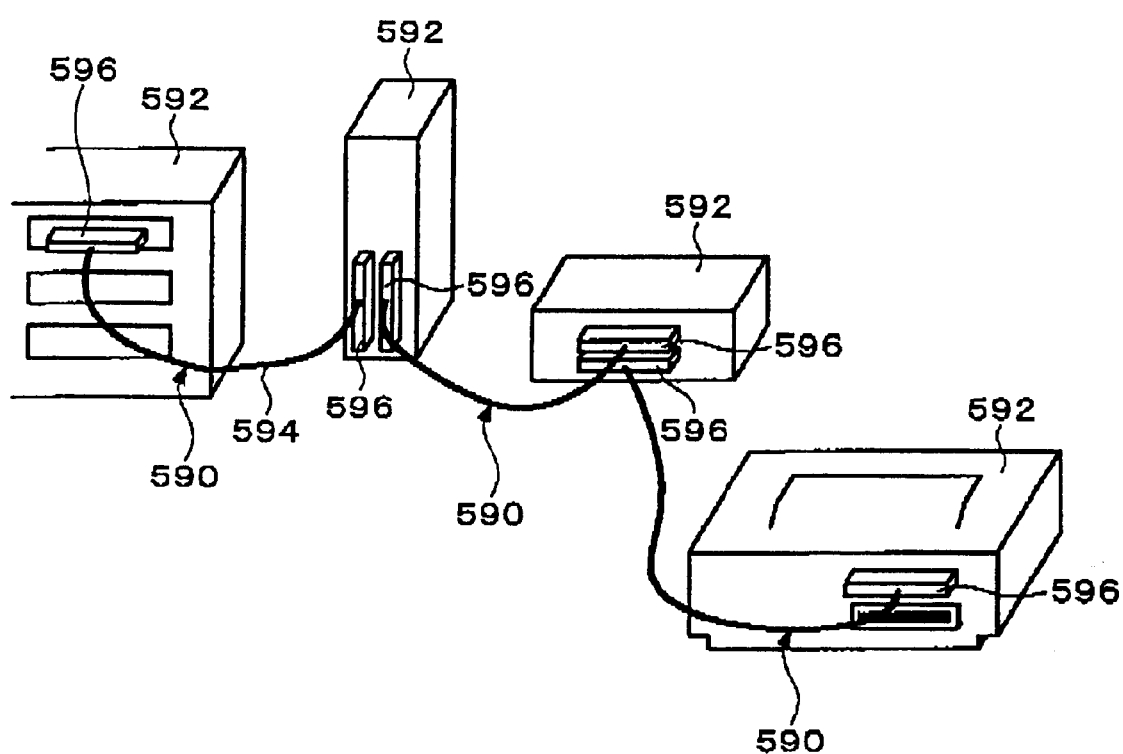
FIG. 38 shows an eighth embodiment of an optical transmission device according to the present invention.

FIG. 38 shows an eighth embodiment of an optical transmission device according to the present invention. The optical transmission device 590 connects together electronic instruments 592, such as computers, displays, storage devices, printers, and the like. The electronic instruments 592 may be data communications devices. The optical transmission device 590 may have a cable 594 with a plug 596 provided at each end. The cable 594 includes one or a plurality (at least one) optical fiber 30 (see FIG. 2). The plug 596 may incorporate a semiconductor chip.

The optical element 50 connected to one end of the optical fiber 30 is a light-emitting element. The electrical signal output by one electronic instrument 592 is converted to an optical signal by the optical element 50 which is a light-emitting element. The optical signal is transmitted by the optical fiber 30, and input to the other optical element 50. This optical element 50 is a light-receiving element, and converts the input optical signal into an electrical signal. Then the electrical signal is input to the other electronic instrument 592. Thus, by means of the optical transmission device 590 of this embodiment, information can be transferred between the electronic instruments 592 by optical signals.

Ninth Embodiment

Figure 39:
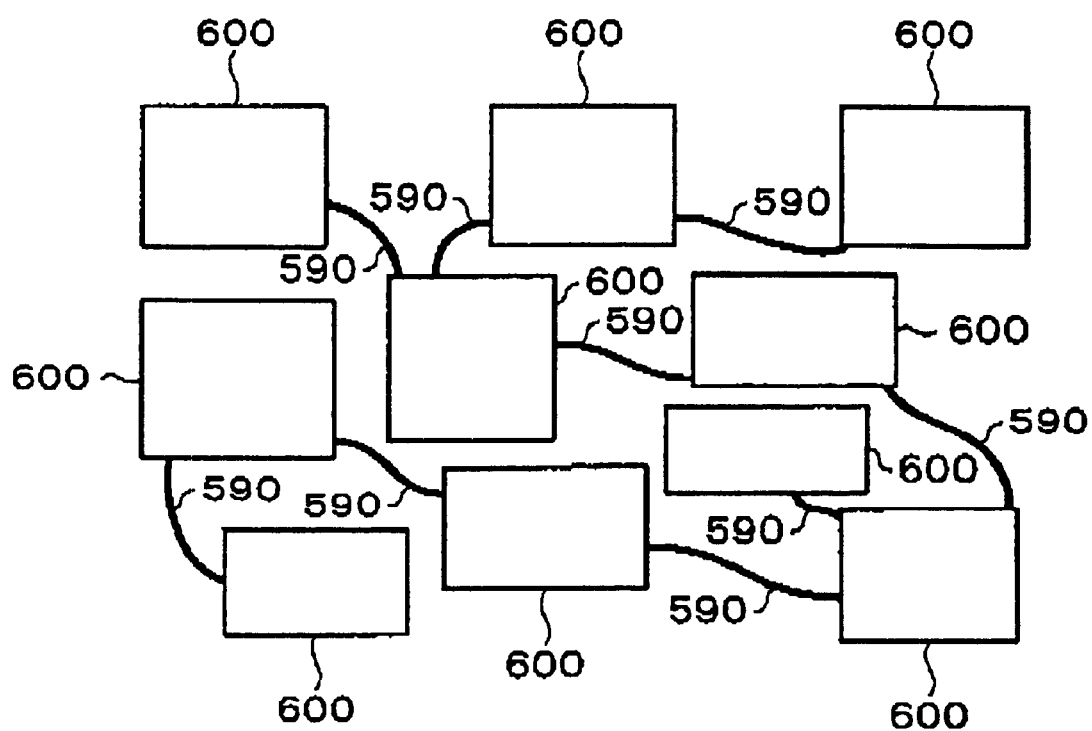
FIG. 39 shows a ninth embodiment of an optical transmission device according to the present invention.

FIG. 39 shows a ninth embodiment of an optical transmission device according to the present invention. The optical transmission device 590 connects electronic instruments 600. As the electronic instrument 600 may be cited: liquid crystal display monitor or CRTs with digital support (These may be used in the financial, direct marketing, medical, and educational fields.), liquid crystal projectors, plasma display panels (PDP), digital TVs, retail cash registers (for POS (Point of Sale Scanning)), videos, tuners, games consoles, printers, and the like.

What is claimed is:

1. A method of manufacturing a platform comprising steps of:
   providing a mold having first and second regions with an interconnecting line which adheres to at least one of the first and second regions;
   disposing an optical fiber with one end surface of the optical fiber facing the mold;
   sealing the optical fiber and the interconnecting line with a molding material, avoiding the one end surface and a surface of the interconnecting line which is in contact with the mold; and
   removing the interconnecting line and the molding material together with the optical fiber from the mold.

2. The method of manufacturing a platform as defined in claim 1,
   wherein the interconnecting line is formed of wire, and both ends of the wire are bonded to the first and second regions.

3. The method of manufacturing a platform as defined in claim 2,
   wherein a bonding pad is previously provided to the mold, and the wire is bonded to the bonding pad.

4. The method of manufacturing a platform as defined in claim 1,
   wherein the interconnecting line is formed of a conductive layer, and the conductive layer is formed in the first and second regions.

5. The method of manufacturing a platform as defined in claim 1,
   wherein the optical fiber and the interconnecting line are sealed by the molding material, a mold release agent being applied to the mold.

6. The method of manufacturing a platform as defined in claim 1, wherein a support member for the optical fiber is attached to the mold, and wherein the optical fiber is disposed being positioned by the support member.

7. The method of manufacturing a platform as defined in claim 1, wherein the optical fiber is disposed being positioned by inserting the one end of the optical fiber in a hole formed in the mold.

8. The method of manufacturing a platform as defined in claim 7, wherein the first region of the mold is formed substantially even, and wherein the hole is formed in the first region.

9. The method of manufacturing a platform as defined in claim 7, wherein the mold has a projected portion in the first region, and the hole is formed in the upper surface of the projected portion.

10. The method of manufacturing a platform as defined in claim 1, wherein the mold is formed with the first region projecting further than the second region, and wherein an indent corresponding to a shape of the mold is formed in the molding material.

11. The method of manufacturing a platform as defined in claim 1, wherein the mold has a projection, and the interconnecting line is adhered to a region in which the projection is formed, and wherein a recess is formed in the molding material.

12. The method of manufacturing a platform as defined in claim 11, further comprising a step of filling the recess with a conductive material.

13. The method of manufacturing a platform as defined in claim 1, wherein an electronic component electrically connected to the interconnecting line is mounted over the mold, and wherein the optical fiber and the interconnecting line, and the electronic component are sealed with the molding material.

14. The method of manufacturing a platform as defined in claim 1, wherein the mold has the first region, the second region provided in a position lower than the first region, and a third region provided between the first and the second regions, and wherein in the step of providing the interconnecting line, the interconnecting line is adhered to the first or second region, and the third region.

15. A method of manufacturing an optical module comprising steps of fabricating a platform by the method as defined in claim 1, mounting an optical element over the platform, and electrically connecting the optical element and the interconnecting line.

16. The method of manufacturing an optical module as defined in claim 15, comprising a step of providing a resin which seals the optical element.

17. The method of manufacturing an optical module as defined in claim 16, wherein at least between the optical fiber and the optical element, a resin having a light transmitting property is formed as the resin.

18. The method of manufacturing an optical module as defined in claim 15, wherein the mold has the first region, the second region provided in a position lower than the first region, and a third region provided between the first and the second regions, wherein in the step of providing the interconnecting line, the interconnecting line is adhered to the first or second region, and the third region, and wherein a semiconductor chip is mounted in the third region of the platform.

19. A platform comprising a resin molded component, and an interconnecting line at least part of which exposes from the molded component, the exposed surface of the at least part of the interconnecting line being level with a surface of the molded component, in which an optical fiber having one end surface exposed is fixed to the molded component.

20. The platform as defined in claim 19, wherein a metal support member embedded in the molded component is further comprised, and the optical fiber is supported by the support member.

21. The platform as defined in claim 19, wherein an indent is formed in the molded component, and wherein the optical fiber is fixed in the indent with the one end surface exposed.

22. The platform as defined in claim 21, wherein the exposed one end surface of the optical fiber is positioned without projecting from a bottom surface of the indent in the molded component.

23. The platform as defined in claim 19, wherein a recess is formed in the interconnecting line so that a bottom surface of the recess is exposed from the molded component.

24. The platform as defined in claim 23, wherein the recess formed in the interconnecting line is filled with a conductive material.

25. The platform as defined in claim 19, wherein an electronic component electrically connected to the interconnecting line is incorporated in the molded component.

26. An optical module comprising:

the platform as defined in claim 19; and an optical element electrically connected to the interconnecting line and mounted over the platform.

27. The optical module as defined in claim 26, further comprising a resin sealing the optical element.

28. The optical module as defined in claim 27, wherein at least between the optical fiber and the optical element, a resin having a light transmitting property is formed as the resin.

29. An optical transmission device comprising:

a plurality of the platforms as defined in claim 19;

an optical element mounted over each of the platforms; and the optical fiber attached to each of the platforms, wherein the optical element is a light-receiving element or a light-emitting element, and wherein the optical element is electrically connected to the exposed part of the interconnecting line.

30. The optical transmission device as defined in claim 29, further comprising a resin which seals the optical element.

31. The optical transmission device as defined in claim 30, wherein at least between the optical fiber and the optical element, a resin having a light transmitting property is formed as the resin.

32. The optical transmission device as defined in claim 29, further comprising: a plug connected to the optical element.

33. A platform comprising:

a molded component, the molded component having an indent formed therein;

an interconnecting line at least part of which exposes from the molded component; and an optical fiber fixed to the molded component, the optical fiber fixed in the indent with its end surface exposed, wherein the indent has a plurality of bottom surfaces forming steps, and wherein on each of the bottom surfaces, the at least part of the interconnecting line is exposed.

34. An optical module comprising:

the platform as defined in claim 33; and an optical element electrically connected to the interconnecting line and mounted over the platform, wherein the optical element is mounted in the indent so as to face the one end surface of the optical fiber, and wherein a semiconductor chip, which is mounted so as to face a surface of the optical element opposite to a surface facing the optical fiber, and is electrically connected to the interconnecting line, is included in the indent.

35. An optical transmission device comprising:

a plurality of platforms, each of the platforms having a molded component and an interconnecting line at least part of which exposes from the molded component;

an optical fiber fixed to the molded component with its end surface exposed; and an optical element mounted over the molded component, the optical element being a light-receiving element or a light-emitting element, the optical element electrically connected to the exposed part of the interconnecting line, wherein an indent is formed in the molded component, wherein the optical fiber is fixed in the indent with the exposed end surface, wherein the indent has a plurality of bottom surfaces forming steps, wherein on each of the bottom surfaces, the at least part of the interconnecting line is exposed, wherein a semiconductor chip mounted over each of the platforms is further provided, wherein the optical element is mounted in the indent so as to face the one end surface of the optical fiber, and wherein the semiconductor chip is electrically connected to the interconnecting line, and is mounted within the indent so as to face a surface of the optical element opposite to a surface facing the optical fiber.

\* \* \* \* \*